US006842396B2

(12) United States Patent
Kono

(10) Patent No.: US 6,842,396 B2
(45) Date of Patent: Jan. 11, 2005

(54) SEMICONDUCTOR MEMORY DEVICE WITH CLOCK GENERATING CIRCUIT

(75) Inventor: Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 118 days.

(21) Appl. No.: 10/387,503

(22) Filed: Mar. 14, 2003

(65) Prior Publication Data

US 2004/0052152 A1 Mar. 18, 2004

(30) Foreign Application Priority Data

Sep. 17, 2002 (JP) .................................... 2002-270170

(51) Int. Cl.$^7$ .............................................. G11C 7/00
(52) U.S. Cl. ....................................... 365/233; 365/194
(58) Field of Search ................................. 365/233, 194

(56) References Cited

U.S. PATENT DOCUMENTS 6,396,768 B2 * 5/2002 Ooishi ........................ 365/233

FOREIGN PATENT DOCUMENTS

JP      2001-126474      5/2001

* cited by examiner

Primary Examiner—Richard Elms
Assistant Examiner—Pho M. Luu
(74) Attorney, Agent, or Firm—Burns, Doane, Swecker & Mathis, LLP

(57) ABSTRACT

A DLL clock control circuit determines whether or not an operating frequency is a low frequency satisfying a prescribed condition, based on signals received from a DLL circuit and a READ control circuit. When the DLL clock control circuit determines that the operating frequency is a low frequency, the DLL clock control circuit outputs a DLL clock received from the DLL circuit if a first signal to be activated in response to a READ command is activated, while when determining that an operating frequency is not a low frequency, outputting a DLL clock received from the DLL circuit if a second signal to be activated in response to an ACT command is activated. As a result, a semiconductor memory device can guarantees a data output operating in data reading and can reduce power consumption during active standby.

15 Claims, 30 Drawing Sheets

F I G. 1
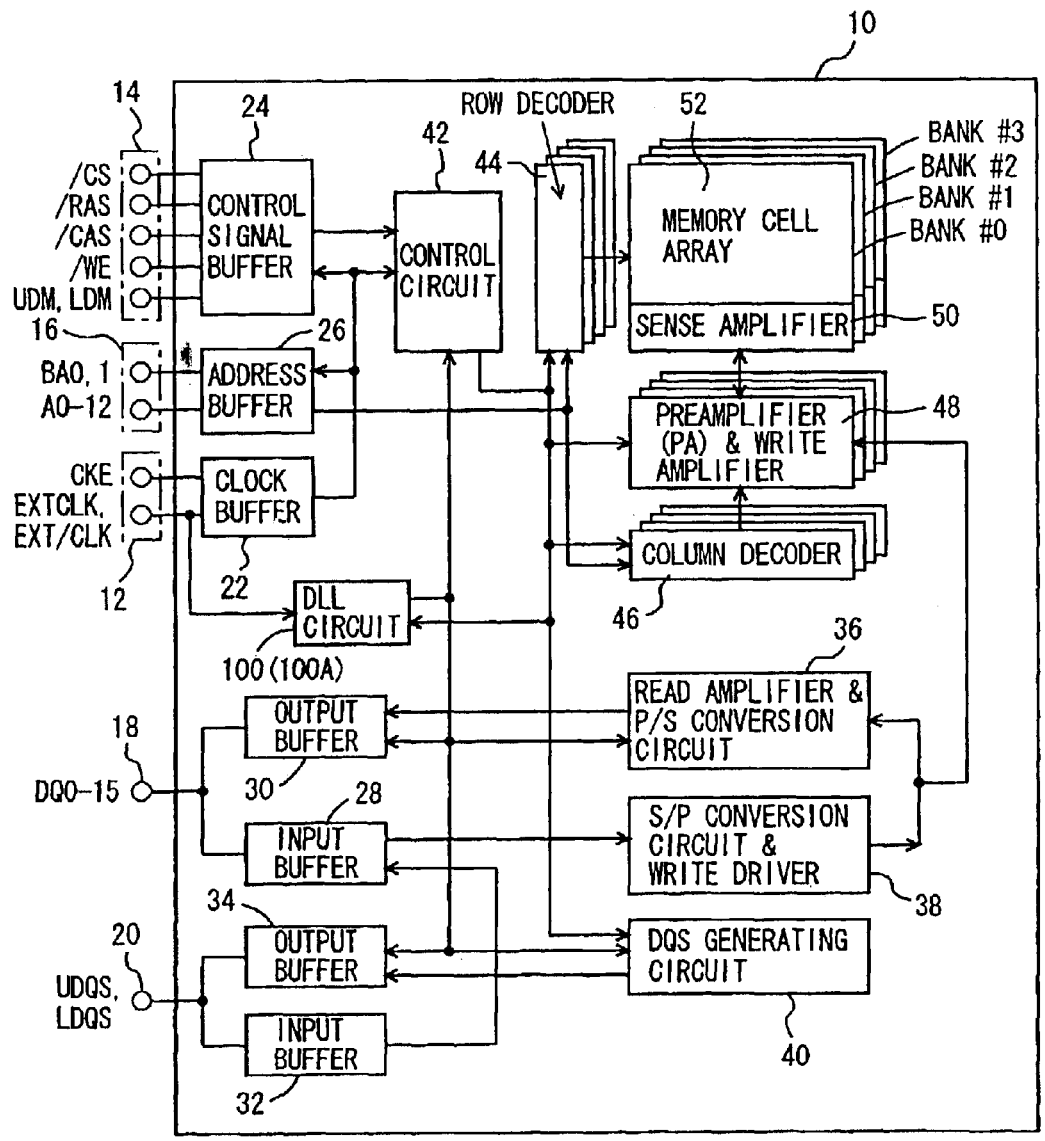

F I G. 2
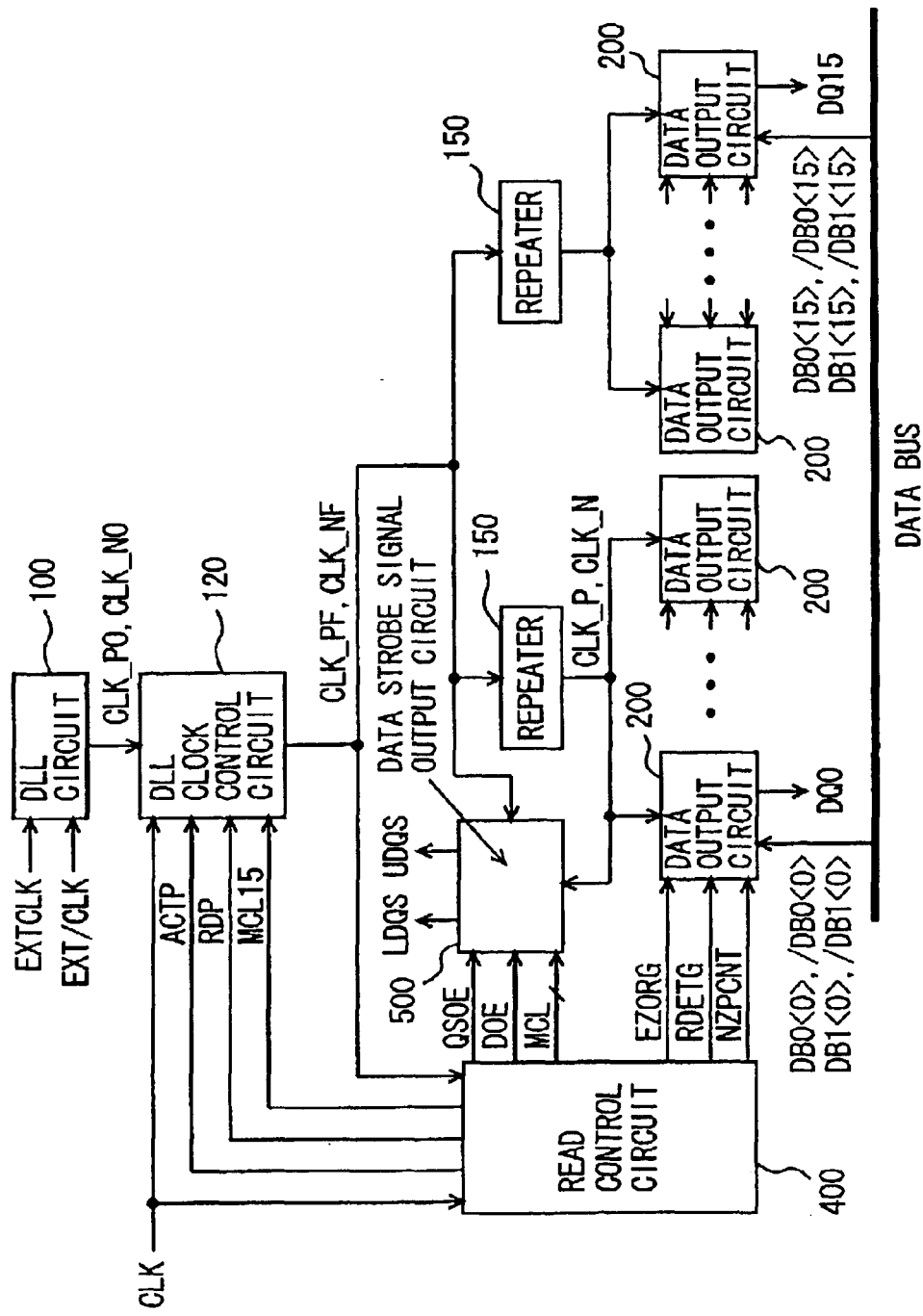

F I G. 2 7
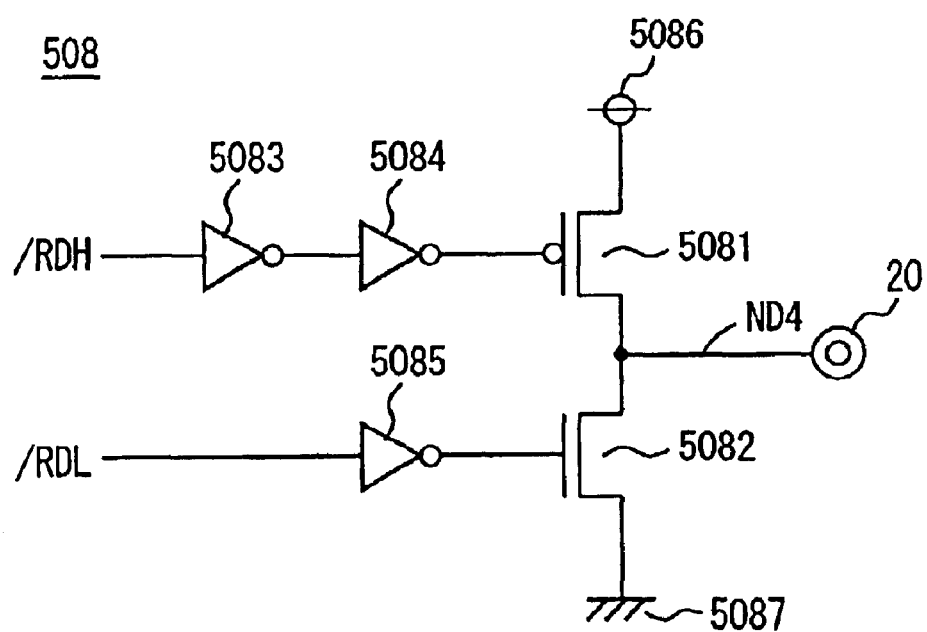

SEMICONDUCTOR MEMORY DEVICE WITH CLOCK GENERATING CIRCUIT

BACKGROUND OF THE INVENTION

1. Field of the Invention

The present invention relates to a semiconductor memory device, and more particularly to a semiconductor memory device which operates in synchronization with a rise and fall of an external clock and which includes a clock generating circuit generating an internal clock in synchronization with the external clock.

2. Description of the Background Art

In a synchronous dynamic random access memory (hereinafter, referred to as SDRAM) operating in synchronization with an external clock supplied externally, a clock generating circuit is installed inside SDRAM and an internal clock in synchronization with the external clock is generated in the clock generating circuit to perform an input-output operation of data using the internal clock. Therefore, an input-output timing of data is largely affected by a phase accuracy of the internal clock thereon.

In recent years, by the demand for a higher frequency operation of a semiconductor memory device, development has been made and put into practical use, of a double data rate SDRAM (hereinafter, referred to as DDR SDRAM) in which inputting and outputting of data are performed in synchronization with a rising edge and falling edge, respectively, of an external clock.

In this DDR SDRAM, a phase difference between an edge of an external clock and an input-output timing of data of the DDR SDRAM is required to be smaller than in a case of a general SDRAM in which inputting and outputting of data are performed in synchronization with only a rising edge of the external clock. That is, this is because, since the DDR SDRAM performs data inputting-outputting at a frequency twice as high as that of the general SDRAM, a drift in phase between an edge of the external clock and a data input-output timing becomes larger relative to a cycle of the external clock.

FIG. 39 is an operating waveform diagram of main signals when data is read from a conventional DDR SDRAM of the first generation type, which is a so-called DDR-I. In the DDR SDRAM shown in the operating waveform diagram, a CAS latency CL is set to 1.5 and a burst length is set to 4. A CAS latency here expresses the number of cycles for the DDR SDRAM to receive a READ command (a command for reading data) externally and then to start to output data to outside, wherein an interval from a rise of external clock EXTCLK till the next rise thereof is one cycle. Note that a burst length expresses the number of bits read out consecutively according to a READ command.

Referring to FIG. 39, the DDR SDRAM outputs a data strobe signal DQS and a data DQ, which is read data, in synchronization with external clocks EXTCLK and EXT/CLK. External clock EXT/CLK is a clock signal complementary to external clock EXTCLK. Furthermore, data strobe signal DQS is a signal coinciding with or in synchronization with a timing edge of data DQ outputted to outside.

A timing difference tAC between an edge of external clocks EXTCLK, EXT/CLK and an output of data DQ is defined so as to be confined in a prescribed range, and in FIG. 39, a timing difference tAC is controlled to be 0. Furthermore, a difference tDQSQ in output timing between data strobe signal DQS and data DQ is also required so as to be confined in a prescribed range.

Furthermore, in DDR-I, data strobe signal DQS in reading data is defined to be generated (CAS latency CL-1) cycle before data DQ starts to be output. This period is called "preamble". In a period of a half cycle after the final data of data DQ starts to be output, data strobe signal DQS is defined so as to be kept at L level (logic low). This period is called "postamble".

In order to realize data output timings as shown in FIG. 39, an internal clock with a timing slightly earlier than a timing of an edge of external clock EXTCLK becomes necessary in a data output circuit outputting data DQ finally to outside. This is because a delay generates in a period after an external clock is inputted to a semiconductor memory device till data is actually outputted, because of capacitance of internal circuits in the semiconductor memory device.

That is, a necessity arises for a clock generating circuit, generating internal clocks CLK_P and CLK_N shifted backward by an adequate amount of time Ta with respect to an edge of external clock EXTCLK by delaying external clock EXTCLK by an adequate delay amount Tdll, since external clock EXTCLK is a signal with a constant cycle, and capable of controlling the delay amount Tdll so that data DQ and data strobe signal DQS outputted from the data output circuit and a data strobe signal output circuit operating using internal clocks CLK_P and CLK_N as triggers satisfy the above timing differences tAC and tDQSQ. A circuit generating such internal clocks is referred to as a DLL (delay locked loop) circuit.

Backward amount Ta is determined by a propagation time after read data is taken in the data output circuit using internal clocks CLK_P and CLK_N as triggers till the read data is read out finally to a data output terminal. Then, as shown in FIG. 39, in a case where a CAS latency is 1.5, the first data of data DQ is outputted in synchronization with a rising edge of EXT/CLK (a falling edge of EXTCLK) and thereafter, odd-numbered data of data DQ is outputted using internal clock CLK_N as a trigger and even-numbered data is outputted using internal clock CLK_P as a trigger, thus sequentially outputting odd-numbered data and even-numbered data to outside.

FIG. 40 is a functional block diagram conceptually describing a READ-related circuitry operating by internal clocks generated by the DLL circuit.

Referring to FIG. 40, a DLL circuit 1100 receives external clocks EXTCLK and EXT/CLK to generate and output DLL clocks CLK_PF and CLK_NF obtained by delaying respective external clocks EXTCLK and EXT/CLK. A repeater 1150 receives DLL clocks CLK_PF and CLK_NF outputted from DLL circuit 1100 to output respective corresponding DLL clocks CLK_P and CLK_N.

A plurality of data output circuits 1200 are provided based on a word organization to which the DDR SDRAM corresponds. Each of data output circuits 1200 receives DLL clock CLK_P and CLK_N outputted from repeater 1150, and takes in data read out onto data bus from a memory cell array to output. In a case of DDR-I, reading data from the memory cell array every one cycle is an operation in 2-bit prefetch in which 2 bit data is read out to each data output circuit in one reading. That is, in each data output circuit 1200, 2 bit data is simultaneously read from the memory cell array in each cycle and the 2 bit data is in a set order transferred in each half cycle to be outputted to outside.

Here, it is common that signal paths to data output circuits 1200 from DLL circuit 1100 is of a tree structure, and the circuits and signal lines are arranged so that the data output timing is not different largely among a plurality of data output circuits 1200. Repeaters 1150 are usually provided on the basis of one repeater 1150 to 8 or 4 data output circuits.

Data strobe signal output circuit 1500 generates and outputs, to outside, data strobe signals LDQS and UDQS indicating timings at which data is outputted from data output circuits 1200 to outside. Data strobe signal output circuit 1500 receives DLL clocks CLK_P and CLK_N outputted from repeater 1150, generates data strobe signals LDQS and UDQS in synchronization with DLL clocks CLK_P and CLK_N during a period from the "preamble" till the "postamble" using a signal QSOE received from a READ control circuit 1400, and outputs thus generated data strobe signal LDQS and UDQS to outside. Here, signal QSOE is a signal for determining an active period of column-related circuits based on burst length BL, in which signal QSOE stays at H (logic high) level during a (a burst length BL/2) cycle after receiving READ command.

READ control circuit 1400 operates in synchronization with internal clock CLK received from a clock buffer not shown, generates various kinds of signals necessary for a data read operation according to READ command, and outputs the signals to data output circuit 1200 and data strobe output circuit 1500.

In company with a trend of down-sizing and low power consumption of electronic equipment in recent years, a requirement for lower power consumption in a semiconductor memory device mounted on the electronic equipment has become severer. In the DDR SDRAM, as a technology for use in realization of lower power consumption, a method is disclosed in Japanese Patent Laying-Open No. 2001-126474 in which reduction of power consumption is realized by improving a synchronous characteristic of output phase.

As shown in FIG. 40, since DLL clocks CLK_P and CLK_N are supplied to various circuits, current consumed by charge and discharge of parasitic capacitance on signal lines, the operations of the various circuits receiving DLL clock and the like amounts to as high a value as several mA. While a proportion of the current related to DLL clock relative to the entire current is low during a period of data reading, the entire current amounts to a value of the order of 20 mA in a standby state where row-related operations are active but none of column-related operations is performed (this state is also referred to as an active standby) and a proportion of the current related to DLL clock relative to the entire currents is very large.

Here, it is possible to reduce the current related to above described DLL clock by activating a circuit at an output stage of DLL circuit 1100 when READ command is received and outputting neither of DLL clocks CLK_PF and CLK_NF except for during data read operation.

However, since the time in which DLL clocks are transmitted to various circuits after READ command is received is constant, it is hard to stably supply DLL clocks to the various circuits before data output is started when CAS latency is short or when the operation frequency is high. Especially, as described above, a necessity arises for providing a "preamble" in one cycle prior to data output in data strobe signal DQS, and DLL clock needs to be supplied to data strobe signal output circuit 1500 at an earlier timing.

Referring again to FIG. 39, when CAS latency CL is 1.5, a circuit at an output stage of DLL circuit 1100 is necessary to be activated so as to be in time for DLL clock CLK_NF corresponding to the first DLL clock CLK_N after READ command is received in order to start the "preamble" in synchronization with external clocks EXTCLK and EXT/CLK 0.5 cycle after READ command is received. In reality, it is desirable that before signal QSOE, which is an original signal of data strobe signal DQS, is outputted to data strobe signal output circuit 1500 from READ control circuit 1400, a circuit at an output stage of DLL circuit 1100 is activated, and DLL clock CLK_NF corresponding to the first DLL clock CLK_N after above described READ command is received is outputted from DLL circuit 1100.

In the following description, consideration will be given to an operating frequency of a DDR SDRAM satisfying the conditions. Circuits in the DDR SDRAM operate in synchronization with internal clock CLK outputted from a clock buffer taking in external clocks EXTCLK and EXT/CLK thereinto except for a case where DLL clock CLK_P and CLK_N are used in order to acquire data input-output timing.

If a time after READ control circuit 1400 receives internal clock CLK till outputting signal QSOE is Tda, a cycle of external clocks EXTCLK and EXT/CLK is Tck, a delay time of internal clock CLK behind external clocks EXTCLK and RXT/CLK is Tdc and a propagation time of a signal from DLL circuit 1100 to data output circuit 1200 is Tdp by definition, a necessity arises for establishing the following equation in order to satisfy the above conditions.

$$Tdc+Tda<Tck/2-(Ta+Tdp) \quad (1)$$

Here, time Ta is a backward amount of DLL clocks CLK_P and CLK_N relative to above described external clock EXTCLK and EXT/CLK. The left-hand side of the equation (1) is a time till signal QSOE is generated from the external clocks EXTCLK and EXT/CLK at which READ command is received. On the other hand, the right-hand side thereof is a time till the first DLL clock CLK_NF is generated from the external clocks EXTCLK and EXT/CLK at which READ command is received. By rearranging the equation (1) with respect to cycle Tck, the following equation is obtained:

$$Tck>2\times((Tdc+Tda)+(Ta+Tdp)) \quad (2)$$

That is, the equation (2) means that when an operating cycle is equal to or less than a time shown by the right-hand side, in other words, in a case of being equal to or higher than an operating frequency, generation of the "preamble" of data strobe signal DQS is short of time even if a circuit at an output stage of DLL circuit 1100 is activated after READ command is received, which means disabling of proper output control.

In a case where in a conventional DDR SDRAM, CAS latency CL is set to 1.5, an operation is set in advance so that transmission control of DLL clocks is not performed by READ command when being used in a high frequency or in a case where an operating margin is not sufficient. In such a case, DLL clocks is commonly controlled in transmission based on ACT command activating row-related operations.

While the "preamble" output of data strobe signal DQS is guaranteed according to transmission control of DLL clock with ACT command, transmission control of DLL clock according to READ command is not performed during the use at a frequency satisfying the equation (1), therefore disabling reduction in currents in the active standby.

Furthermore, backward amount Ta and times Tda and Tdc are changed by operating environment such as an environmental temperature and external/internal voltages. As can be understood from the equation (1), an operating frequency satisfying the conditions changes according to an environment in which DDR SDRAM is actually used. That is, even when an operation is set so that transmission control of DLL clock is enabled according to ACT command based on a preliminary study, a case can also be arisen where the equation (1) is sufficiently satisfied in an actually used environment. A conventional DDR SDRAM, however, was not able to be adapted to such fluctuations in operating environment.

SUMMARY OF THE INVENTION

The present invention has been made to solve the problem and it is an object of the present invention to provide a semiconductor memory device capable of guaranteeing a data output operation in data reading and reducing power consumption during active standby.

According to the present invention, a semiconductor memory device which inputs and outputs data in synchronization with a rise and fall of an external clock, includes: a memory cell array storing data; a clock generating circuit generating first and second internal clocks corresponding to the rise and fall of the external clock, respectively; a data output circuit receiving the first and second internal clocks to output the data read from the memory cell array to outside based on the first and second internal clocks; a data strobe signal output circuit receiving the first and second internal clocks, generating a data strobe signal coinciding with or in synchronization with an output timing of the data outputted to outside from the data output circuit, and outputting the data strobe signal to outside based on the first and second internal clocks; and an internal clock control circuit receiving the first and second internal clocks, detecting an operating frequency of the semiconductor memory device based on the first and second internal clocks, and controlling a transmission period during which the first and second internal clocks generated in the clock generating circuit are transmitted to the data output circuit and the data strobe signal output circuit, based on the operating frequency.

Therefore, according to the present invention, since the first and second internal clocks are transmitted after receiving a data read command when an operating frequency is low, power consumption during the active standby is reduced, while since, when an operating frequency is high, the first and second internal clocks are transmitted starting before receiving a data read command, a data output operation is guaranteed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an overall block diagram schematically showing a configuration of a semiconductor memory device according to the present invention;

FIG. 2 is a functional block diagram conceptually describing a READ-related circuit operating with a DLL clock generated in a DLL circuit;

FIG. 27 is a circuit diagram showing a circuit configuration of an output driver shown in FIG. 7;

DESCRIPTION OF THE PREFERRED EMBODIMENTS

Figure 3:
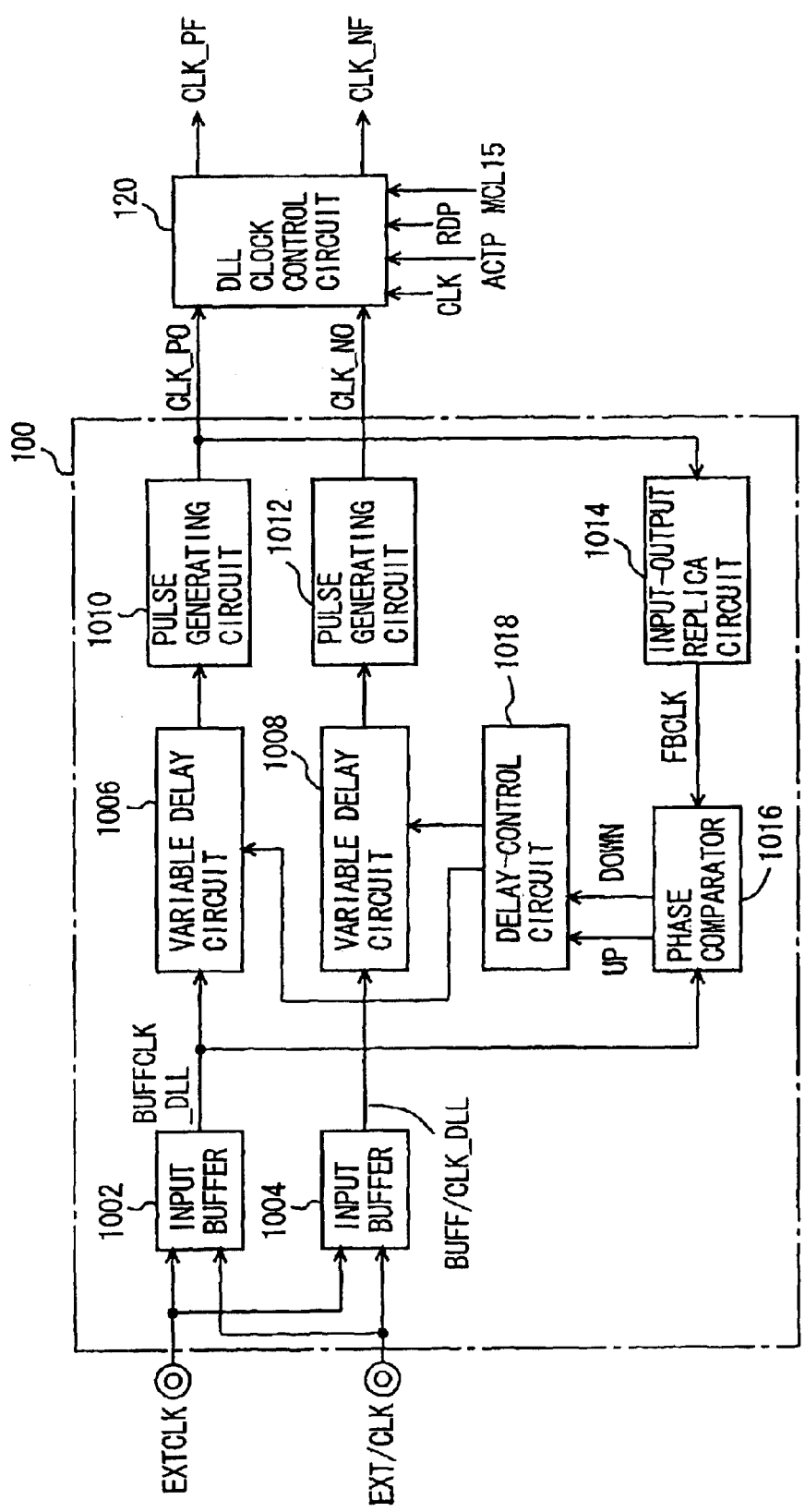
FIG. 3 is a functional block diagram functionally describing the DLL circuit shown in FIG. 2.

Detailed description will be given of embodiments of the present invention below with reference to the accompanying drawings. Note that the same symbols are attached to the same or corresponding constituents in the figures and none of descriptions thereof will be repeated.

First Embodiment

FIG. 1 is an overall block diagram schematically showing a configuration of a semiconductor memory device according to the present invention.

Referring to FIG. 1, a semiconductor memory device 10 includes: a clock terminal 12; a control signal terminal 14; an address terminal 16: a data input-output terminal 18 and a data strobe signal input-output terminal 20.

Semiconductor memory device 10 further includes: a clock buffer 22; a control signal buffer 24; an address buffer 26: an input buffer 28 and an output buffer 30 related to data DQ0 to DQ15; and an input buffer 32 and an output buffer 34 related to data strobe signals UDQS and LDQS.

Semiconductor memory device 10 further includes: a read amplifier & P/S (parallel/serial) conversion circuit 36; an S/P (serial/parallel) conversion circuit & write driver 38; a DQS generating circuit 40; and a DLL circuit 100.

Semiconductor memory device 10 further includes: a control circuit 42; a row decoder 44; a column decoder 46; a preamplifier & write amplifier 48; a sense amplifier 50; and a memory cell array 52.

Note that in FIG. 1, only a main part related to data inputting-outputting is typically shown, in semiconductor memory device 10.

Semiconductor memory device 10 is of a 2-bit prefetch configuration in which 2×n bits (n is a bit width in the semiconductor memory device, and n=16 in semiconductor memory device 10) is read from memory cell array 52 in one data read operation repeatedly performed each cycle. That is, 2 bit data is read from memory cell array 52 to each of n data output circuits in each cycle and 2 bit data is transferred in each of the data output circuits in a set order in each cycle and outputted to outside.

In data writing, semiconductor memory device 10 takes in n bit data (where n=16) in each half cycle in synchronization with a rise and fall of data strobe signal and writes data taken in 2 half cycles to memory cell array 52 in each cycle.

Clock terminal 12 receives external clock EXTCLK, external clock EXT/CLK complementary thereto and a clock enable signal CKE. Control signal terminal 14 receives command control signals including a chip select signal /CS, a row address strobe signal /RAS, a column address strobe signal /CAS, a write enable signal /WE and input-output DQ mask signals UDM and LDM. Address terminal 16 receives address signals A0 to A12 and a bank address signals BA0 and BA1.

Clock buffer 22 receives external clocks EXTCLK and EXT/CLK, and clock enable signal CKE to generate internal clock CLK and to output it control signal buffer 24, address buffer 26 and control circuit 42. Control signal buffer 24 takes in and latches chip select signal /CS, row address strobe signal /RAS, column address strobe signal /CAS, write enable signal /WE and input-output DQ mask signals UDM and LDM in synchronization with internal clock CLK received from clock buffer 22 to output the command control signals to control circuit 42. Address buffer 26 takes in and latches address signals A0 to A12 and bank address signals BA0 and BA1 in synchronization with internal clock CLK received from clock buffer 22 to generate internal address signals and to output the signals to row decoder 44 and column decoder 46.

Data input-output terminal 18 is a terminal for supplying or receiving data to be read from or written to semiconductor memory device 10, receives data DQ0 to DQ15 inputted externally in data writing, and outputs data DQ0 to DQ15 to outside in data reading. Data strobe signal input-output terminal 20, in data writing, receives from outside data strobe signal UDQS and LDQS coinciding with or in synchronization with a timing edges of data DQ0 to DQ15 inputted externally, while in data reading, outputs to outside data strobe signals UDQS and LDQS coinciding with or in synchronization with timing edges of outputted data DQ0 to GQ15 to outside.

Input buffer 28 inputs data DQ0 to DQ15 in synchronization with data strobe signals UDQS and LDQS received by input buffer 32 from outside.

Output buffer 30 operates in synchronization with a DLL clock generated by DLL circuit 100 to output data DQ0 to DQ15 to data input-output terminal 18 in each half cycle. Output buffer 34 together with output buffer 30 outputting data DQ0 to DQ15 operates in synchronization with DLL clock to output data strobe signals UDQS and LDQS generated by DQS generating circuit 40 to data strobe signal input-output terminal 20.

In data reading, read amplifier & P/S conversion circuit 36 amplifies read data received from preamplifier & write amplifier 48 to output data including 2 bits read at a time in a set order as data DQi (i is 0 from 15) to output buffer 30. In data writing, S/P conversion circuit & write driver 38 outputs data DQi received from input buffer 28 at a rate of 1 bit per half cycle at a rate of 2 bits in parallel in each cycle to preamplifier & write amplifier 48.

Control circuit 42 takes in command control signals in synchronization with internal clock CLK to control row decoder 44, column decoder 46 and preamplifier & write amplifier 48 based on the taken in command control signals. By doing so, data DQ0 to DQ15 is read from or written to memory cell array 52. Furthermore, control circuit 42 also controls generation of data strobe signal in DQS generating circuit 40 based on the taken in command control signals.

Memory cell array 52 storing data is constituted of 4 banks each operable independently of the others and reading and writing of data are performed through sense amplifier 50.

DLL circuit 100 generates and outputs DLL clocks CLK_PF and CLK_NF obtained by delaying external clocks EXTCLK and EXT/CLK. DLL clocks CLK_PF and CLK_NF outputted from DLL circuit 100 are inputted to output buffers 30 and 34, read amplifier & P/S conversion circuit 36 and DQS generating circuit 40 and control circuit 42 through a DLL clock control circuit and a repeater not shown in FIG. 1.

FIG. 2 is a functional block diagram conceptually describing a READ-related circuit operating with a DLL clock generated in DLL circuit 100.

Referring to FIG. 2, DLL circuit 100 receives external clocks EXTCLK and EXT/CLK to generate and output internal clocks CLK_PO and CLK_NO obtained by delaying external clocks EXTCLK and EXT/CLK.

DLL clock control circuit 120 is placed in the vicinity of DLL circuit 100. DLL clock control circuit 120 receives internal clocks CLK_PO and CLK_NO outputted from DLL circuit 100, signals ACTP, RDP and MCL15 outputted from READ control circuit 400, and internal clock CLK, based on the signals, control outputs of DLL clock CLK_PF and CLK_NF. Note that description will be given of signals ACTP, RDP and MCL15 together with later description of a configuration of DLL clock control circuit 120.

Repeater 150 receives DLL clocks CLK_PF and CLK_NF outputted from DLL clock control circuit 120 to output corresponding DLL clocks CLK_P and CLK_N, respectively.

A plurality of data output circuits 200 are provided based on a word organization to which semiconductor memory device 10 corresponds and provided here are 16 data output circuits 200 outputting data DQ0 to DQ15. Each of data output circuits 200 receives DLL clocks CLK_P and CLK_N outputted from repeater 150 and is activated by one of DLL clocks CLK_P and CLK_N selected according to signal NZPCNT received from READ control circuit 400 to take in data read out on a data bus from memory cell array 52 and output the data to outside.

It is common that signal paths from DLL circuit 100 to data output circuits 200 are of a tree structure as shown in FIG. 2 and the circuits and signal lines are arranged giving a consideration to an aim that no much of a difference occurs in output timing of data among a plurality of data output circuits 200. Repeaters 150 are commonly provided on the basis of one to 8 or 4 data output circuits.

Data strobe signal output circuit 500 generates and output, to outside, data strobe signals LDQS and UDQS indicating timings at which read data outputted from data output circuit 200 is outputted to outside. Data strobe signal output circuit 500 receives DLL clocks CLK_P and CLK_N outputted from repeater 150 to generate data strobe signals LDQS and UDQS based on DLL clocks CLK_P and CLK_N during a period between the "preamble" and the "postamble" using signal QSOE received from READ control circuit 400 and to output generated data strobe signals LDQS and UDQS to outside.

READ control circuit 400 operates in synchronization with internal clock CLK to generate various kinds of necessary signals for a data read operation according to READ command to output the necessary signals to data output circuits 200 and data strobe signal output circuit 500.

Note that description will be given of signals QSOE, DOE, MCL, EZORG, RDETG and NZPCNT, in later description of configurations of data output circuits 200 and data strobe signal output circuit 500 in which the above signals are used.

FIG. 3 is a functional block diagram functionally describing DLL circuit 100 shown in FIG. 2. Note that also shown in FIG. 3 is DLL clock control circuit 120 placed in the vicinity of DLL circuit 100.

Referring to FIG. 3, DLL circuit 100 includes: input buffers 1002 and 1004; variable delay circuits 1006 and 1008; pulse generating circuits 1010 and 1012; an input-output replica circuit 1014; a phase comparator 1016 and a delay control circuit 1018.

Input buffer 1002 receives external clocks EXTCLK and EXT/CLK inputted externally to detect an intersection between a potential level in a rise of external clock EXTCLK and a potential level in a fall of external clock EXT/CLK, which is an inversion thereof, and to generate internal clock BUFFCLK_DLL. Input buffer 1004 receives external clocks EXTCLK and EXT/CLK inputted externally to detect an intersection between a potential level in a fall of external clock EXTCLK and a potential level in a rise of external clock EXT/CLK and to generate internal clock BUFF/CLK_DLL.

Variable delay circuit 1006 delays internal clock BUFFCLK_DLL received from input buffer 1002 to output the delayed internal clock to pulse generating circuit 1010. Variable delay circuit 1006 includes a plurality of delay units generating delays to delay internal clock BUFFCLK_DLL by connecting or disconnecting the delay units based on a command from delay control circuit 1018.

Pulse generating circuit 1010 generates internal clock CLK_PO as a pulse signal in synchronization with a rising edge of a signal outputted from variable delay circuit 1006.

Variable delay circuit 1008 delays internal clock BUFF/CLK_DLL received from input buffer 1004 to output the delayed internal clock to pulse generating circuit 1012. A configuration of variable delay circuit 1008 is the same as that of variable delay circuit 1006 and no description thereof is repeated.

Pulse generating circuit 1012 generates internal clock CLK_NO as a pulse signal in synchronization with a rising edge of a signal outputted from variable delay circuit 1008.

Input-output replica circuit 1014 imitatively performs reproduction of input buffer 1002; and a circuit characteristic in a period after internal clocks CLK_PO and CLK_NO are outputted from DLL circuit 100 till data DQ is outputted to data input-output terminal to generate internal clock FBCLK obtained by giving delay amounts generated by the circuits to internal clock CLK_PO.

Phase comparator 1016 compares, in phase, internal clock FBCLK outputted from input-output replica circuit 1014 with internal clock BUFFCLK_DLL after one cycle or several cycles elapse to generate control signals UP and DOWN for increase or decrease delay amounts of variable delay circuits 1006 and 1008 based on the phase difference.

Delay control circuit 1018 generates a delay control signal based on control signals UP and DOWN to output the delay control signal and adjust delay amounts in variable delay circuits 1006 and 1008. When internal clock BUFFCLK_DLL and internal clock FBCLK coincide with each other in phase, neither of outputs of control signals UP and DOWN occurs from phase comparator 1016 and a delay control signal assumes a fixed value to fix delay amounts of variable delay circuits 1006 and 1008.

Thereby, internal clocks CLK_PO and CLK_NO become signals leading external clocks EXTCLK and EXT/CLK by the sum of a delay amount from DLL circuit 100 to data output circuit 200 and a data output delay amount in data output circuit 200. Therefore, when a delay amount given by input-output replica circuit 1014 coincides with a total delay amount of input buffer 1002, repeater 150 and data output circuit 200, above described timing difference tAC becomes 0.

On the other hand, when internal clock BUFFCLK_DLL and internal clock FBCLK does not coincide, in phase, with each other, control signals UP or DOWN is outputted from phase comparator 1016 according to a phase difference to connect or disconnect delay units in variable delay circuits 1006 and 1008 for adjustment of a delay amount.

Figure 4:
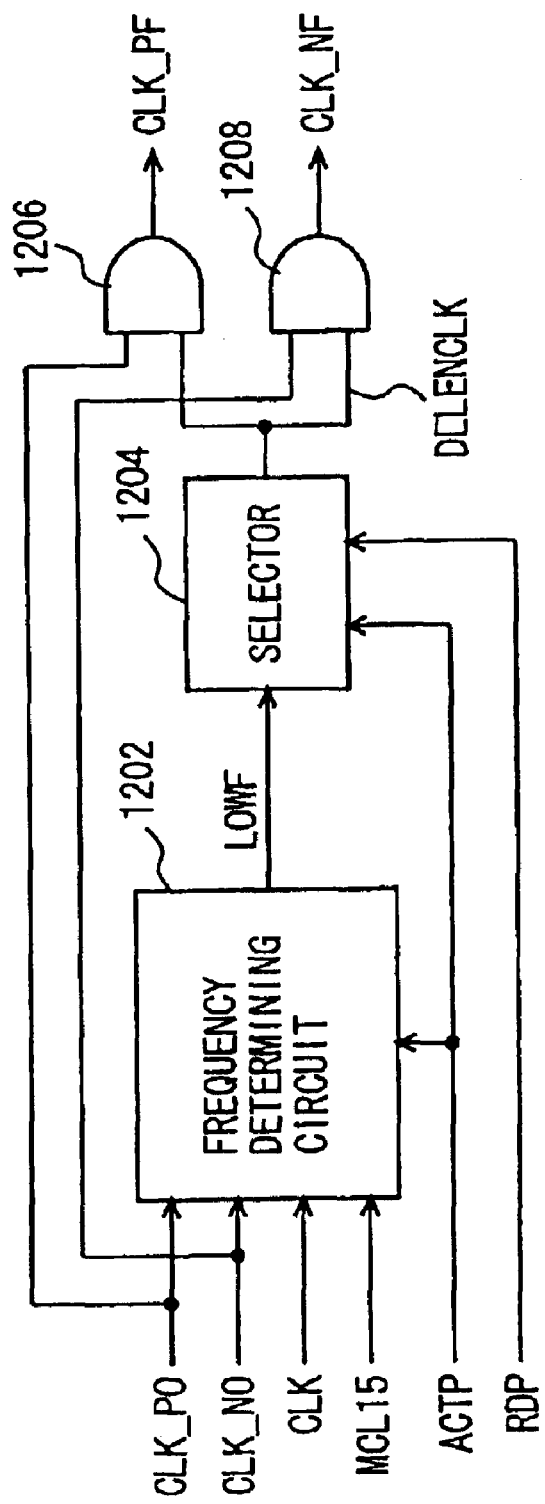
FIG. 4 is a functional block diagram functionally describing a DLL clock control circuit shown in FIG. 2.

FIG. 4 is a functional block diagram functionally describing DLL clock control circuit 120 shown in FIG. 2. Referring to FIG. 4, DLL clock control circuit 120 includes: a frequency determining circuit 1202; a selector 1204; and AND gates 1206 and 1208.

Frequency determining circuit 1202 receives internal clocks CLK_PO and CLK_NO, internal clock CLK and signals MCL15 and ACTP to output signal LOWF. Frequency determining circuit 1202 determines whether or not an operating frequency is a frequency guaranteeing the "preamble" output of data strobe signal to output a result of the determination as signal LOWF. To be concrete, it is determined whether or not an operating frequency satisfies the condition of the equation (1) described above. Frequency determining circuit 1202 performs this determining operation when CAS latency is a prescribed value. Note that in the first embodiment, this value is set to 1.5 and it is notified by signal MCL15 to frequency determining circuit 1202 from READ control circuit 400 that CAS latency is 1.5.

Frequency determining circuit 1202 outputs signal LOWF at H level when determining that an operating frequency is a low frequency capable of guaranteeing the "preamble" (such a case is hereinafter referred simply to as "in a case where an operating frequency is low"). On the other hand, frequency determining circuit 1202 outputs signal LOWF at L level when determining that an operating frequency is too high to guarantee the "preamble," (such a case is hereinafter referred simply to as "in a case where an operating frequency is high").

Frequency determining circuit 1202 performs a determining operation for a frequency only during a period when row-related circuits are inactive, and furthermore, performs a determining operation at a prescribed sampling frequency during this period. To be concrete, frequency determining circuit 1202 detects a frequency during a half of the period when row-related circuits are inactive to perform a determining operation described above. The reason why a determining operation is repeated at a prescribed frequency is that power consumption in frequency determining circuit 1202 is reduced.

Selector 1204 receives signals ACTP and RDP and signal LOWF to generate and output enable signal DLLENCLK. Selector 1204, when signal LOWF is at H level, that is "in a case where an operating frequency is low", outputs output enable signal DLLENCLK at H level at a timing when signal RDP takes H level. On the other hand, selector 1204, when signal LOWF is at L level, that is "in a case where an operating frequency is high", outputs output enable signal DLLENCLK at H level at a timing when signal ACTP takes H level.

Signal RDP, here, is a signal taking H level during a period till at least a burst operation is ends with internal clock CLK corresponding to a cycle when READ command is received as the start, that is, during at least a period of a (CAS latency CL+a burst length BL/2) cycle. Signal ACTP is a signal taking at H level during a period when row-related circuits are active till PRE command (a command instructing a precharge operation) is received after ACT command is accepted.

AND gate circuit 1206 performs a logical product operation internal clock CLK_PO and output enable signal DLLENCLK to output a result of the operation as DLL clock CLK_PF. AND gate 1208 performs a logical product operation of internal clock CLK_NO and output enable signal DLLENCLK to output a result of the operation as DLL clock CLK_NF.

By doing so as described above, DLL clock control circuit 120 determines whether an operating frequency is a low frequency or a high frequency, in other words determines whether or not an operating frequency satisfies the condition of the equation (1), and in a case where an operation frequency is low, outputs DLL clocks CKL_PF and CLK_NF starting after READ command is received, while in a case where an operation frequency is high, outputs DLL clocks CKL_PF and CLK_NF based on ACT command.

Figure 5:
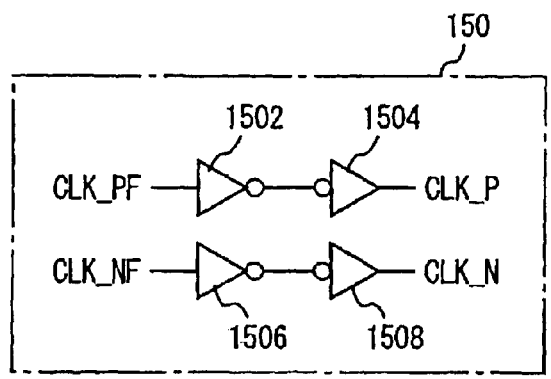
FIG. 5 is a circuit diagram showing a configuration of a repeater shown in FIG. 2.

FIG. 5 is a circuit diagram showing a configuration of repeater 150 shown in FIG. 2.

Referring to FIG. 5, repeater 150 includes: an inverter 1502 outputting a signal, which is inversion of internal clock CLK_PF; an inverter 1504 inverting an output signal from inverter 1502 to output DLL clock CLK_P; an inverter 1506 inverting internal clock CLK_NF to output the inverted signal; and an inverter 1508 inverting an output signal from inverter 1506 to output DLL clock CLK_N.

Figure 6:
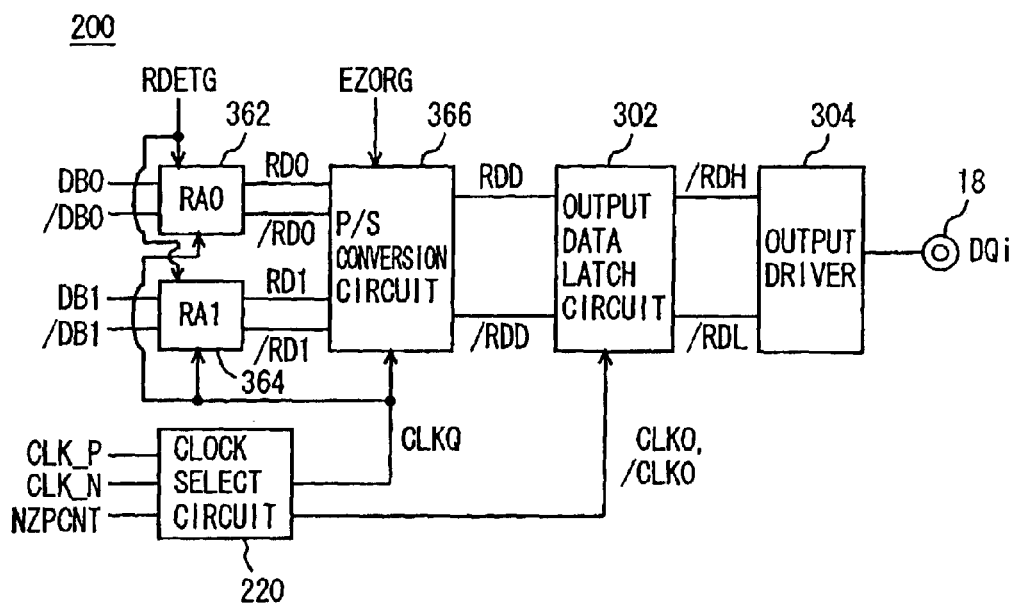
FIG. 6 is a functional block diagram functionally describing a data output circuit shown in FIG. 2.

FIG. 6 is a functional block diagram functionally describing data output circuit 200 shown in FIG. 2.

Referring to FIG. 6, data output circuit 200 includes: amplifying circuits 362 and 364; a parallel/serial (P/S) conversion circuit 366; an output data latch circuit 302; an output driver 304 and a clock select circuit 220.

Amplifying circuits 362 and 364 receives signal RDETG outputted from READ control circuit 400, amplifying circuit 362 is connected to data buses DB0 and /DB0 in a period when signal RDETG is at H level and amplifying circuit 364 is connected to data bus pair DB1 and /DB1. Signal RDETG, here, is a signal for taking in data from data bus pair in amplifying circuits 362 and 364, and controlled in READ control circuit 400 so as to take H level at a prescribed timing.

Amplifying circuit 362 operates in each cycle in synchronization with a amplifying circuit activating signal CLKQ outputted from clock select circuit 220 to read data read out onto data bus pair DB0 and /DB0 from memory cell array 52, to amplify a signal level of the read data and to output the read data to parallel/serial conversion circuit 366. Amplifying circuit 364 operates in each cycle in synchronization with amplifying circuit activating signal CLKQ, similarly to amplifying circuit 362, to read data read out onto data bus pair DB1 and /DB1 from memory cell array 52 at the same timing as in reading of data onto data bus pair DB0 and /DB0, to amplify a signal level of the read data and to output the read data to parallel/serial conversion circuit 366.

Parallel/serial conversion circuit 366 operates similarly to amplifying circuits 362 and 364 in each cycle in synchronization with amplifying circuit activating signal CLKQ, receives data RD0 and /RD0 (which are complementary to each other and each 1 bit data) and data RD1 and /RD1 outputted from respective amplifying circuits 362 and 364, and outputs data RD0 and /RD0 and data RD1 and /RD1 in an order set based on signal EZORG outputted from READ control circuit 400 to output data latch circuit 302. Signal EZORG here is a signal reflecting information of the lowest order bit CA0 of a column address given simultaneously with READ command and generated in READ control circuit 400 based on the lowest order bit CA0.

Out put data latch circuit 302 receives and latches data RDD and /RDD outputted from parallel/serial conversion circuit 366 to transfer 1 bit data at a time to output driver 304 in synchronization with output trigger signals CLKO and /CLKO activated in each half cycle, outputted from clock select circuit 220. Output driver 304 outputs data DQi to outside through data input-output terminal 18.

Clock select circuit 220 generates amplifying circuit activating signal CLKQ activating amplifying circuits 362 and 364, and parallel/serial conversion circuit 366 based on DLL clock CLK_P and CLK_N, and output trigger signal CLKO and /CLKO activating output data latch circuit 302.

As described above, since in semiconductor memory device 10, a 2 bit prefetch configuration is adopted, a necessity arises for clock select circuit 220 to generate amplifying circuit activating signal CLKQ using one of DLL clocks CLK_P and CLK_N corresponding to the first data output timing as the start point.

Therefore, clock select circuit 220 selects one of internal clocks CLK_P and CLK_N based on signal NZPCNT whose logic level is different according to whether CAS latency CL is an integer or a half integer in consideration of CAS latency defining the first data output timing to generate amplifying circuit activating circuit CLKQ, and outputs the signal to amplifying circuits 362 and 364 and parallel/serial conversion circuit 366 for activation thereof.

Clock select circuit 220 generates output trigger signals CLKO and /CLKO serving as a trigger for transferring data RDD and /RDD received by output data latch circuit 302 from parallel/serial conversion circuit 366 at a rate of 1 bit in each half cycle to output driver 304. Output trigger signal CLKO is a clock signal of a logic sum of DLL clocks CLK_P and CLK_N and output trigger signal /CLKO is a signal complementary to output trigger signal CLKO.

Figure 7:
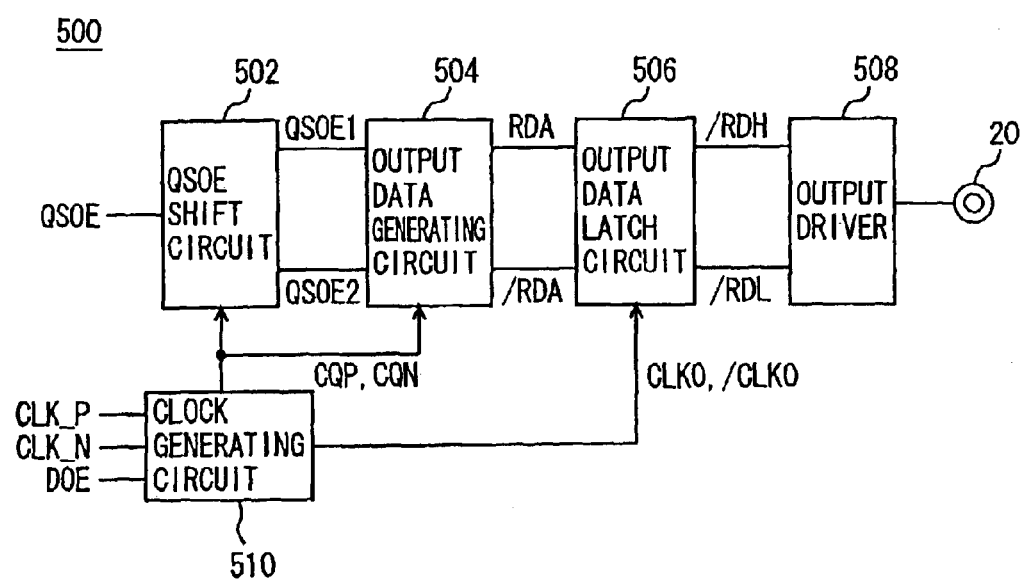
FIG. 7 is a functional block diagram functionally describing a data strobe signal output circuit shown in FIG. 2.

FIG. 7 is a functional block diagram functionally describing data strobe signal output circuit 500 shown in FIG. 2. Here, in FIG. 2, 2 data strobe signals LDQS and UDQS corresponding to the lower order bit and the higher order bit, respectively, of outputted data DQ are outputted from data strobe output circuit 500. Although separate circuits are provided for outputting these two signals, configurations of the both circuits are the same as each other; therefore in FIG. 7, there is shown a circuit for one signal.

Referring to FIG. 7, data strobe signal output circuit 500 includes: a QSOE shift circuit 502; an output data generating circuit 504; an output data latch circuit 506; an output driver 508; and a clock generating circuit 510.

Clock generating circuit 510 receives DLL clocks CLK_P and CLK_N outputted from repeater 150 and signal DOE outputted from READ control circuit 400 to generate control clocks CQP and CQN activating QSOE shift circuit 502 and output data generating circuit 504; and output trigger signal CLKO and /CLKO activating output data latch circuit 506. Signal DOE here is a signal taking H level during a period when a READ operation is performed.

QSOE shift circuit 502 receives signal QSOE outputted from READ control circuit 400 to generate signals QSOE1 and QSOE2 obtained by shifting signal QSOE by a prescribed amount in synchronization with control clocks CQP and CQN outputted from clock generating circuit 510.

Signal QSOE here is a signal for determining an active period of a column-related circuit based on a burst length BL and is kept at H level during a period of a (burst length BL/2) cycle starting at a time when READ command is received. Generated signal QSOE1 is a signal to determine the "preamble" period and signal QSOE2 is a signal to determine a period in which data strobe signal DQS transitions in synchronism with data DQ.

Output data generating circuit 504 generates data RDA and /RDA for generating data strobe signal DQS from when the "preamble" period starts till the "postamble" period ends based on signals QSOE1 and QSOE2 outputted from QSOE shift circuit 502, in synchronization with control clocks CQP and CQN outputted from clock generating circuit 510.

Output data latch circuit 506 and output driver 508 operate in each half cycle in synchronization with output trigger signals CLKO and /CLKO outputted from clock generating circuit 510. Output data latch circuit 506 and output driver 508 are of the same configurations as output data latch circuit 302 and output driver 304 in data output circuit 200, respectively, shown in FIG. 6.

As described above, it is ideal that there exists no difference in phase between an output of data DQ and an output of data strobe signal DQS, while in reality, a necessity arises for controlling output timings of both signals so as to be confined within a timing difference tDQSQ. Therefore, in output data latch circuit 506 in data strobe signal output circuit 500 as well, similar to output data latch circuit 302 in data output circuit 200, output trigger signals CLKO and /CLKO generated from DLL clocks CLK_P and CLK_N are used as an output trigger for data strobe signal DQS.

Actually, output data latch circuit 506 and output driver 508 are fabricated so that dimensions of each of transistors constituting the circuits are the same as those in output data latch circuit 302 and output driver 304 in data output circuit 200, and furthermore, a layout of configuration is also designed in common to both cases so that timing difference tDQSQ is the smallest possible.

Figure 8:
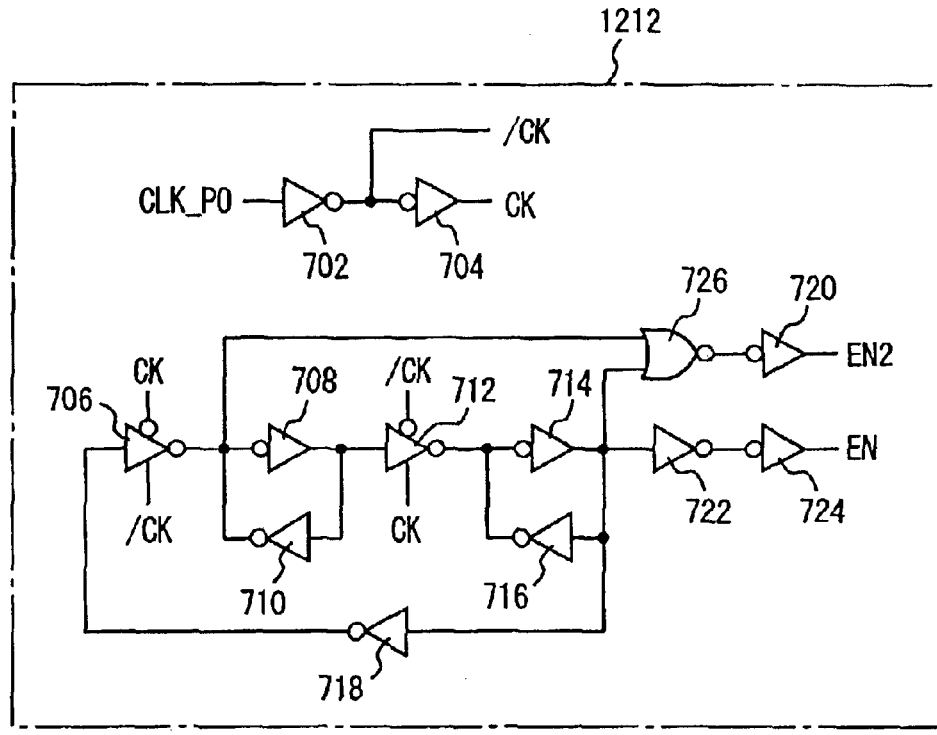
FIG. 8 is a first circuit diagram showing a configuration of a frequency determining circuit shown in FIG. 4.
Figure 9:
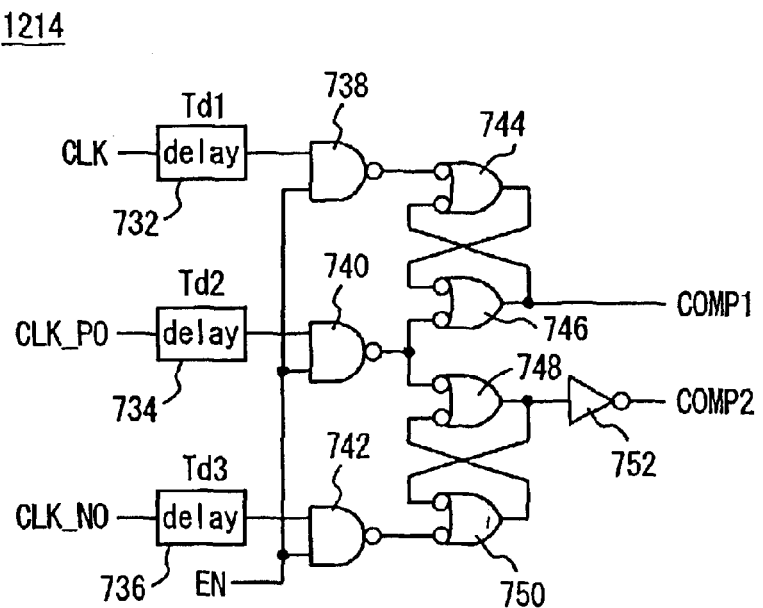
FIG. 9 is a second circuit diagram showing a configuration of the frequency determining circuit shown in FIG. 4.
Figure 10:
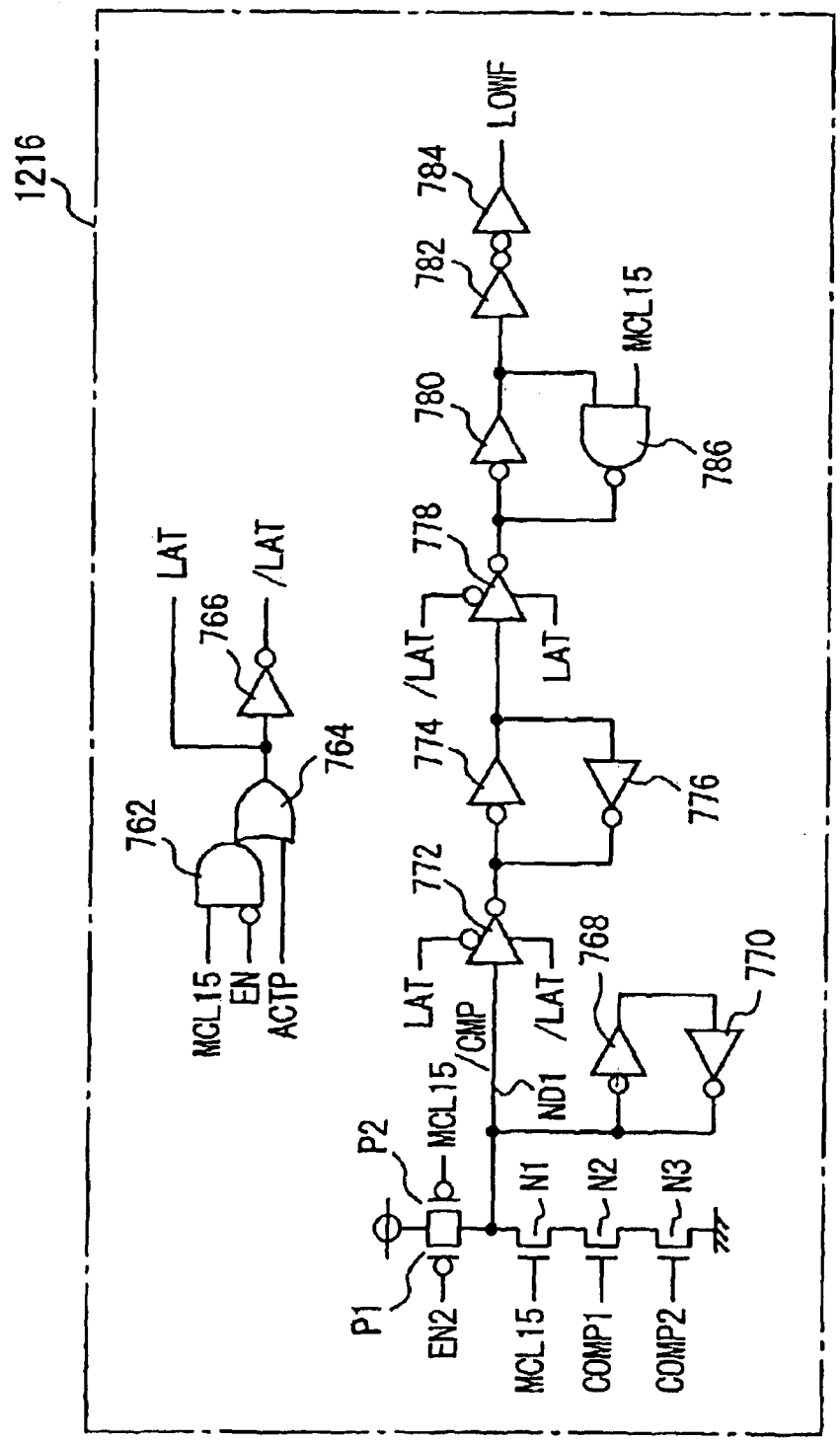
FIG. 10 is a third circuit diagram showing a configuration of the frequency determining circuit shown in FIG. 4.

FIGS. 8 to 10 are circuit diagrams showing frequency determining circuit 1202 shown in FIG. 4. Frequency determining circuit 1202 includes a frequency dividing circuit 1212; a signal generating circuit 1214; and a determining circuit 1216.

Referring to FIG. 8, frequency dividing circuit 1212 included in frequency determining circuit 1202 is constituted of inverters 702 to 724; and NOR gate 726. Inverter 702 inverts internal clock CLK_PO received from DLL circuit 100 to output clock /CK. Inverter 704 outputs inverts clock /CK to output clock CK. That is, clock CK and clock /CK are signals complementary to each other.

Inverter 706 is activated when clock CK is at L level (clock /CK is at H level) to output a signal obtained by inverting an output signal from inverter 718. Inverters 708 and 710 constitutes a latch circuit holding an output signal from inverter 706. Inverter 712 is activated when clock CK is at H level (clock /CK is at L level) to output a signal obtained by inverting an output signal from inverter 708. Inverters 714 and 716 constitutes a latch circuit holding an output signal from inverter 712. Inverter 718 outputs a signal obtained by inverting an output signal from inverter 714 to output to inverter 706.

Inverter 722 outputs a signal obtained by inverting an output signal from inverter 714 and inverter 724 inverts an output signal from inverter 722 to output signal EN. NOR gate 726 performs a logical sum operation of output signals from inverters 710 and 714 to output a signal obtained by inverting a result of the operation, and inverter 720 inverts an output signal from NOR gate 726 to output signal EN2.

Signals EN and EN2 generated based on internal clock CLK_PO is a signal for determining a sampling frequency at which frequency determining circuit 1202 determines a frequency. In frequency dividing circuit 1212, signal EN and EN2 is both signals each having a cycle ½ times a generation cycle of internal clock CLK_PO, and a frequency determining operation is performed at the cycle. Signals EN and EN2 rises simultaneously and signal EN falls at a rise of internal clock CLK_PO, while signal EN2 falls at a fall of internal clock CLK_PO. Description will given of the reason therefor in description of a configuration of determining circuit 1216 for which signals EN and EN2 are used.

Referring to FIG. 9, a signal generating circuit 1214 included in frequency determining circuit 1202 includes: delay circuits 732 to 736; NAND gates 738 to 750; and inverter 752. Delay circuit 732 outputs a signal obtained by delaying internal clock CLK by a time Td1. Delay circuit 734 outputs a signal obtained by delaying internal clock CLK_PO by time Td2. Delay circuit 736 outputs a signal obtained by delaying internal clock CLK_NO by time Td3. NAND gate 738 performs a logical product operation of an output signal from delay circuit 732 and signal EN to output a signal obtained by inverting a result of the operation. NAND gate 740 performs a logical product operation of an output signal from delay circuit 734 and signal EN to output a signal obtained by inverting a result of the operation. NAND gate 742 performs a logical product operation of an output signal from delay circuit 736 and signal EN to output a signal obtained by inverting a result of the operation.

NAND gate 744 performs a logical product operation of outputs from NAND gates 738 and 746 to output a signal obtained by inverting a result of the operation. NAND gate 746 performs a logical product operation of outputs from NAND gates 740 and 744 to invert a result of the operation and to output a comparison signal COMP1. NAND gate 748 performs a logical product operation of outputs from NAND gates 740 and 750 to output a signal obtained by inverting a result of the operation. NAND gate 750 performs a logical product operation of outputs from NAND gates 742 and 748 to output a signal obtained by inverting a result of the operation. inverter 752 inverts an output signal from NAND gate 748 to output a comparison signal COMP2.

Delay time Td1 delayed by delay circuit 732 is a time corresponding to time Tda in above equation (1). That is, delay circuit 732 imitates a period after READ control circuit 400 receives internal clock CLK till outputting signal QSOE in terms of time. Time Td2 delayed by delay circuit 734 is a time in which it is awaited that a state of signal EN generated based on internal clock CLK_PO becomes fixed with certainty. Time Td3 delayed by delay circuit 736 is a time corresponding to time Tdp in above equation (1). That is, delay circuit 736 imitates propagation of a signal from DLL circuit 100 to data output circuit 200 in terms of time.

Comparison signal COMP1 takes H level after time Td2 elapses from internal clock CLK_PO and takes L level after time Td1, that is Tda, elapses from internal clock CLK. That is, comparison signal COMP1 is a signal imitating a time on the left-hand side of equation (1). On the other hand, comparison signal COMP2 takes L level after time Td2 elapses from internal clock CLK_PO and takes L level after time Td3, that is Tdp elapses from internal clock CLK_NO. That is, comparison signal COMP2 is a signal imitating a time on the right-hand side of equation (1). By detecting which of comparison signals COMP1 and COMP2 is ahead of the other by determining circuit 1216 described later, it is determined whether or not the condition expressed by equation (1) is satisfied.

Referring to FIG. 10, determining circuit 1216 included in frequency determining circuit 1202 includes: an AND gate 762; an OR gate 764; inverters 766 to 784; NAND gate 786; P-channel MOS transistors P1 and P2; and N-channel MOS transistors N1 to N3. AND gate 762 performs a logical product operation of an inverted signal of signal EN and signal MCL15 to output a result of the operation. OR gate 764 operates a logical sum operation of an output signal from AND gate 762 and signal ACTP to output a result of the operation as signal LAT. Inverter 766 inverts an output signal from OR gate 764 to output signal /LAT.

P-channel MOS transistors P1 and P2 are connected in parallel between power supply node and node ND1 and receives signals EN2 and MCL15, respectively, at the gates thereof. N-channel MOS transistor N1 is connected between node ND1 and N-channel MOS transistor N2 and receives signal MCL15 at the gate thereof. N-channel MOS transistor N2 is connected between N-channel MOS transistors N1 and N3 and receives comparison signal COMP1 at the gate thereof. N-channel MOS transistor N3 is connected between N-channel MOS transistor N2 and ground node, and receives comparison signal COMP2 at the gate thereof.

Inverters 768 and 770 constitute a latch circuit holding signal /CMP on node ND1. Inverter 772 is activated when signal LAT is at L level (when signal /LAT is at H level) to output a signal obtained by inverting signal /CMP. Inverters 774 and 776 constitute a latch circuit holding an output signal from inverter 772. Inverter 778 is activated when signal /LAT is at L level (when signal LAT is at H level) to output a signal obtained by inverting the output signal from inverter 774.

NAND gate 786 performs a logical product operation of an output signal from inverter 780 and signal MCL15 to output a signal obtained by inverting a result of the operation. When signal MCL15 is at H level, inverter 780 and NAND gate 786 constitute a latch circuit holding an output signal from inverter 778. Inverter 782 outputs a signal obtained by inverting an output signal from inverter 780 and inverter 784 inverts an output signal from inverter 782 to output signal LOWF.

A circuit constituted of P-channel MOS transistors P1 and P2 and N-channel MOS transistors N1 to N3 detects which of comparison signals COMP1 and COMP2 is earlier than the other. That is, node ND1 is pulled up to a power supply voltage level in a period when signal EN2 is at L level; and after signal EN2 takes H level, N-channel MOS transistors N2 and N3 are not simultaneously turned on and node ND1 is maintained at power supply voltage level if a fall of comparison signal COMP1 is earlier than a rise of comparison signal COMP2. That is, signal /CMP takes H level.

On the other hand, if a fall of comparison signal COMP1 is later than a rise of comparison signal COMP2, N-channel MOS transistors N2 and N3 are simultaneously turned on during a period between a rise of comparison signal COMP2 and a fall of comparison signal COMP1; therefore, node ND1 takes ground voltage level. That is signal /CMP takes L level.

Note that when signal MCL15 is at L level, that is CAS latency CL is a value other than 1.5, node ND1 is pulled up to power supply voltage level at all times and there is not performed a determining operation of equation (1) using comparison signals COMP1 and COMP2.

A result of a determining operation by a circuit constituted of P-channel MOS transistors P1 and P2 and N-channel MOS transistors N1 to N3 is outputted from the inverter 772 in a period when inverter 772 is active. That is, determining circuit 1216 performs a determining operation during a period when signal LAT is at L level. Since signal LAT is a signal taking L level when signals EN and ACTP takes H and L levels, respectively, a determining circuit 1216 performs a determining operation for an operating frequency only during a half of a period when row-related circuits are inactive.

That is, during the period when row-related circuits are inactive, determining circuit 1216 performs a determining operation when signal EN takes H level, and when signal EN2 takes L level after signal EN takes L level, node ND1 is pulled up to power supply voltage level. In this way, signal EN is used as a signal for setting determining circuit 1216 and signal EN2 is used as a signal for resetting determining circuit 1216.

Figure 11:
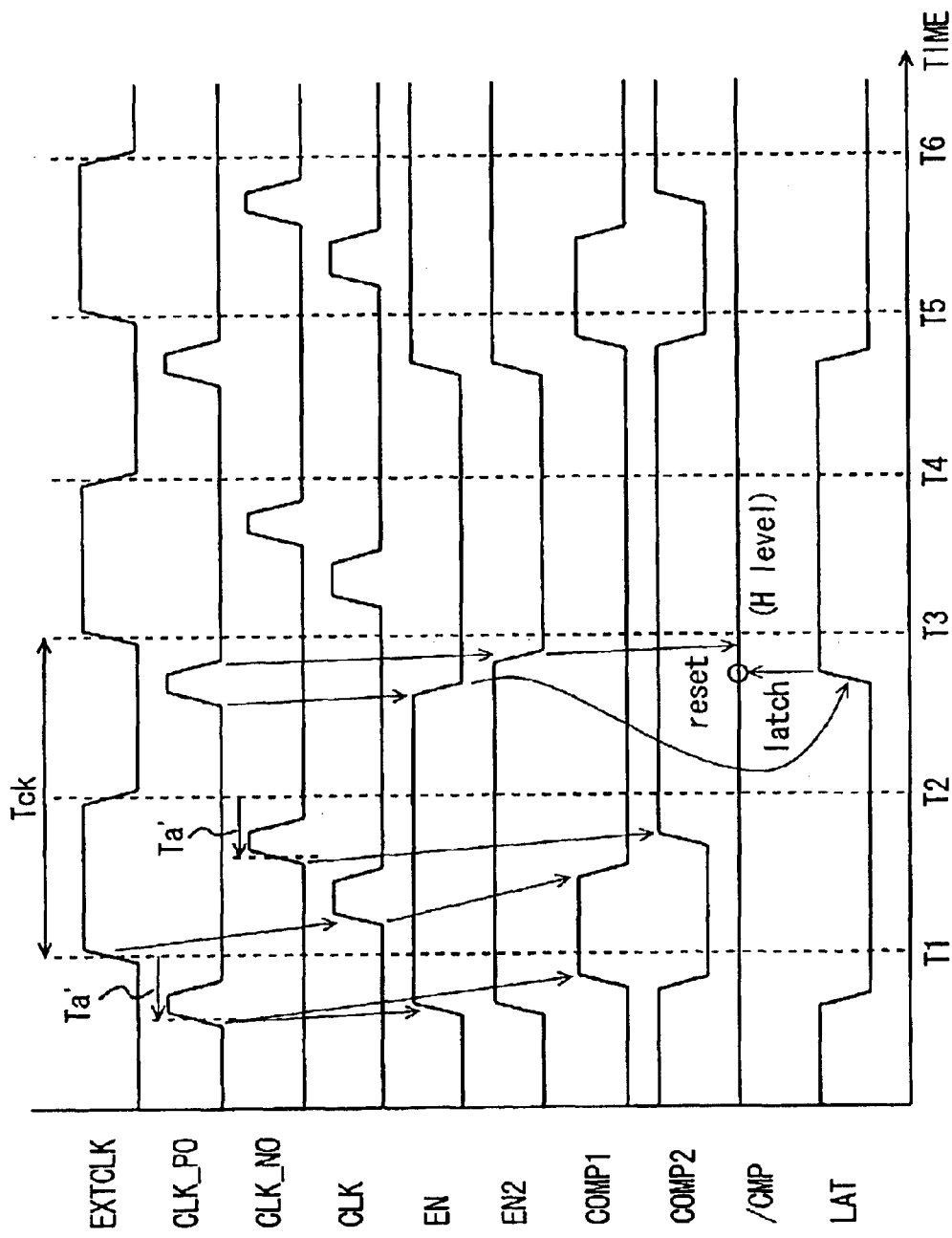
FIG. 11 is an operating waveform diagram of typical signals in a frequency determining circuit at a low frequency.
Figure 12:
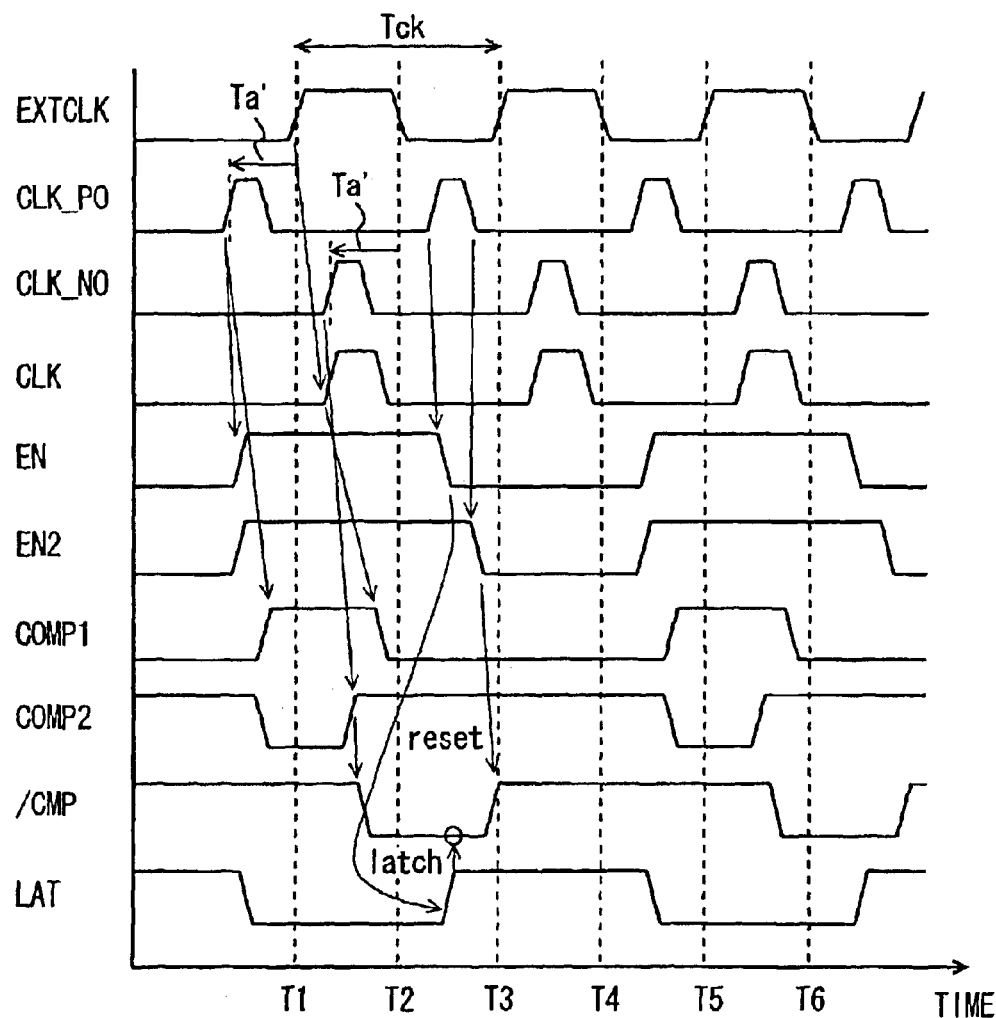
FIG. 12 is an operating waveform diagram of typical signals in a frequency determining circuit at a high frequency.

FIGS. 11 and 12 are operating waveform diagrams of typical signals in frequency determining circuit 1202. FIG. 11 is an operating waveform diagram of typical signals in frequency determining circuit 1202 when an operating frequency is low and FIG. 12 is an operating waveform diagram of typical signals in frequency determining circuit 1202 when an operating frequency is high. Note that it is set so that signals MCL15 and ACTP are at H and L levels, respectively. That is, it is set that CAS latency CL is 1.5 and row-related circuits are inactive.

At first, description will be given of and operating waveforms in a case where an operating frequency is low. Referring to FIG. 11, when dividing circuit 1212 of frequency determining circuit 1202 receives internal clock CLK_PO shifted backward by time Ta' with respect to a rising edge of external clock EXTCLK at a time point T1, dividing circuit 1212 outputs signals EN and EN2 at H level. When signal generating circuit 1214 receives internal clock CLK_PO, the circuit outputs comparison signals COMP1 and COMP2 at H and L levels, respectively.

On the other hand, if signal generating circuit 1214 receives internal clock CLK corresponding to a rising edge of external clock EXTCLK at time point T1, the circuit outputs comparison signal COMP1 at L level when time Td1 elapses. Furthermore, if signal generating circuit 1214 receives internal clock CLK_NO shifted backward by time Ta' with respect to a falling edge of external clock EXTCLK at time point T2, the circuit outputs comparison signal COMP2 at H level when time Td3 elapses.

Here, since an operating frequency is a low frequency, cycle Tck is long, and a falling timing of comparison signal COMP1 is earlier than a rising timing of comparison signal COMP2, while signal /CMP stays at H level as is. When signal EN takes L level according to internal clock CLK_PO shifted backward by time Ta' with respect to a rising edge of external clock EXTCLK at time point T3, determining circuit 1216 sets signal LAT to H level and latches a state where signal /CMP is at H level at this time. According to this, determining circuit 1216 outputs signal LOWF at H level.

Then, description will be given of operating waveforms in a case where an operating frequency is high. Referring to FIG. 12, when dividing circuit 1212 receives internal clock CLK_PO shifted backward by time Ta' with respect to a rising edge of external clock EXTCLK at time point T1, the circuit outputs signals EN and EN2 at H level. Signal generating circuit 1214, when receiving internal clock CLK_PO, outputs comparison signals COMP1 and COMP2 at H and L levels, respectively.

On the other hand, when signal generating circuit 1214 receives internal clock CLK corresponding to a rising edge of external clock EXTCLK at time point T1, outputs comparison signal COMP1 at L level after time Td1 elapses. Furthermore, when signal generating circuit 1214 receives internal clock CLK_NO shifted backward by time Ta' with respect to a falling edge of external clock EXTCLK at time point T2, the circuit outputs comparison signal COMP2 at H level after time Td3 elapses.

Here, since an operating frequency is a high frequency, cycle Tck is short, and a falling timing of comparison signal COMP1 is behind a rising timing of comparison signal COMP2 and signal /CMP takes L level in response to a rise of comparison signal COMP2. When signal EN takes L level in response to internal clock CLK_PO shifted backward by time Ta' with respect to rising edge of external clock EXTCLK at time point T3, determining circuit 1216 drives signal LAT to H level to latch a state of signal /CMP at L level at this time. According thereto, determining circuit 1216 outputs signal LOWF at L level. Thereafter, when signal EN2 takes L level in response to a fall of internal clock CLK_PO, determining circuit 1216 resets signal /CMP to H level.

Figure 13:
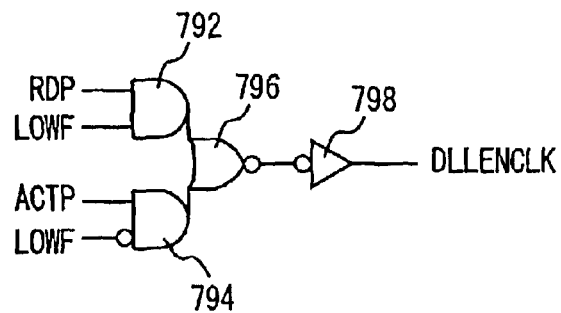
FIG. 13 is a circuit diagram showing a configuration of a selector shown in FIG. 4.

FIG. 13 is a circuit diagram showing a configuration of selector 1204 shown in FIG. 4. Referring to FIG. 13, selector 1204 is constituted of: AND gates 792 and 794; an NOR gate 796; and an inverter 798. AND gate 792 performs a logical product operation of signals RDP and LOWF to output a result of the operation. AND gate 794 performs a logical product operation of an inverted signal of signal LOWF and signal ACTP to output a result of the operation. NOR gate circuit 796 performs a logical sum of output signals from AND gates 792 and 794 to output a signal obtained by inverting a result of the operation. Inverter 798 inverts an output signal from NOR gate 796 to output output enable signal DLLENCLK.

FIGS. 14 to 18 are circuit diagrams showing configurations of clock 30 generating circuit 510 included in data strobe signal output circuit 500 shown in FIG. 7.

Referring to FIGS. 14 to 18, clock generating circuit 510 includes: a /CLK_PE generating circuit 512; a /CLK_NE generating circuit 514; a CLKO generating circuit 516; a CQP generating circuit 518; and a CQN generating circuit 520.

Figure 14:
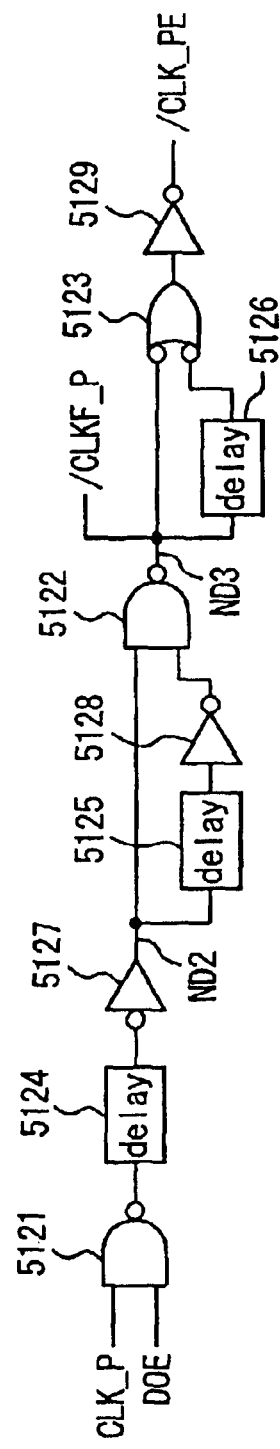
FIG. 14 is a first circuit diagram showing a configuration of a clock generating circuit shown in FIG. 7.

Referring to FIG. 14, /CLK_PE generating circuit 512 is constituted of NAND gates 5121 to 5123; delay circuits 5124 to 5126; and inverters 5127 to 5129. NAND gate 5121 performs a logical product operation of DLL clock CLK_P and signal DOE to output a signal obtained by inverting a result of the operation. Delay circuit 5124 delays an output signal from NAND gate 5121 to output the inverted signal to inverter 5127. Inverter 5127 outputs a signal obtained by inverting an output signal from delay circuit 5124 to a node ND2. Delay circuit 5125 delays a signal on node ND2 to output the delayed signal to inverter 5128. Inverter 5128 outputs a signal obtained by inverting an output signal from delay circuit 5125. NAND gate 5122 performs a logical product operation of a signal on node ND2 and an output signal from inverter 5128 to invert a result of the operation and to output signal /CLKF_P.

Delay circuit 5126 delays an output signal from NAND gate 5122 to output the delayed signal to NAND gate 5123. NAND gate 5123 performs a logical product operation of signal /CLKF_P and an output signal from delay circuit 5126 to output a signal obtained by inverting a result of the operation. Inverter 5129 inverts an output signal from NAND gate 5123 to output signal /CLK_PE.

/CLK_PE generating circuit 512, when signal DOE is at H level, generates a fall pulse signal /CLKF_P with a width of a delay time due to delay circuit 5125 in synchronization with a rising edge of DLL clock CLK_P. Furthermore, /CLK_PE generating circuit 512 generates a fall pulse signal /CLK_PE having a delay time due to delay circuit 5125 and a delay time due to delay circuit 5126 is added thereto in synchronization with a rising edge of DLL clock CLK_P.

Description will be given of operations in /CLK_PE generating circuit 512 below.

When signal DOE is at H level, NAND gate 5121 works as an inverter, and DLL clock CLK_P is delayed by delay circuit 5124, inverted by inverter 5127 and outputted to node ND2. A section constituted of delay circuit 5125, inverter 5128 and NAND gate 5122 is a circuit generating a fall pulse with a width of a delay time due to delay circuit 5125 in synchronization with a rising edge of a signal on node ND2 to thereby generate signal /CLKF_P. NAND gate 5123 receives signal /CLKF_P and a signal obtained by delaying signal /CLKF_P with delay circuit 5126 to output a signal taking at H level during a period from a falling edge of signal /CLKF_P up to a rising edge of a signal obtained by delaying signal /CLKF_P. An signal outputted from NAND gate 5123 is inverted by inverter 5129 to generate signal /CLK_PE.

Figure 15:
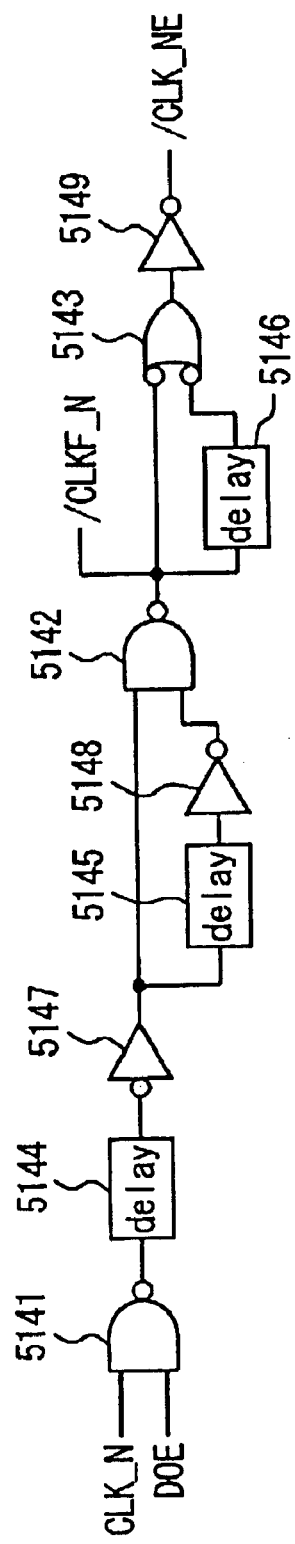
FIG. 15 is a second circuit diagram showing a configuration of the clock generating circuit shown in FIG. 7.

Referring to FIG. 15, /CLKF_NE generating circuit 514 is constituted of: NAND gates 5141 to 5143; delay circuits 5144 to 5146; and inverters 5147 to 5149. /CLK_NE generating circuit 514, similar to /CLK_PE generating circuit 512, generates fall pulse signals /CLKF_N and /CLK_NE from DLL clock CLK_N when signal DOE is at H level. Since a configuration of /CLK_NE generating circuit 514 is the same as that of /CLK_PE generating circuit 512, no description thereof repeated.

Figure 16:
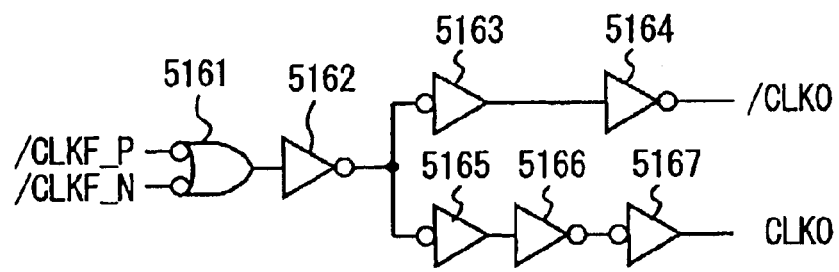
FIG. 16 is a third circuit diagram showing a configuration of the clock generating circuit shown in FIG. 7.

Referring to FIG. 16, CLKO generating circuit 516 includes: a NAND gate 5161; and inverters 5162 to 5167. NAND gate 5161 performs a logical product operation of signals /CLKF_P and /CLKF_N to output a signal obtained by inverting a result of the operation. Inverter 5162 outputs a signal obtained by inverting an output signal from NAND gate 5161. Inverter 5163 outputs a signal obtained by inverting an output signal from inverter 5162 and inverter 5164 inverts an output signal from inverter 5163 to output output trigger signal /CLKO. Furthermore, inverter 5165 outputs a signal obtained by inverting an output signal from inverter 5162 and inverter 5166 outputs a signal obtained by inverting an output signal from the inverter 5165. Inverter 5167 inverts an output signal from inverter 5166 to output output trigger signal CLKO.

CLKO generating circuit 516 generates output trigger signal CLKO in synchronization with fall pulse signals /CLKF_P and /CLKF_N generated by /CLK_PE generating circuit 512 and /CLK_NE 514 generating circuit, respectively, and output trigger signal /CLKO complementary thereto.

Figure 17:
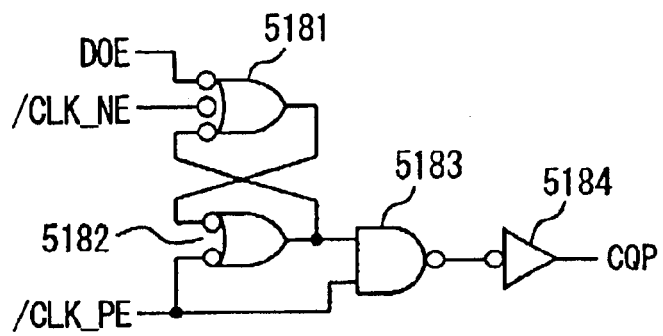
FIG. 17 is a fourth circuit diagram showing a configuration of the clock generating circuit shown in FIG. 7.

Referring to FIG. 17, CQP generating circuit 518 is constituted of: NAND gates 5181 to 5183; and an inverter 5184. NAND gate 5181 performs a logical operation of signal DOE, an output signal /CLK_NE from /CLK_NE generating circuit 514 and an output signal from NAND gate 5182 to output a signal obtained by inverting a result of the operation. NAND gate 5182 performs a logical product operation of output signal /CLK_PE from /CLK_PE generating circuit 512, an output signal from NAND gate 5181 to output a signal obtained by inverting a result of the operation. NAND gate 5183 performs a logical product operation of signal /CLK_PE and an output signal from NAND gate 5182 to inverts a result of the operation to output the inverted result. Inverter 5184 inverts an output signal from NAND gate 5183 to output control signal CQP.

CQP generating circuit 518, when signal DOE is at H level, generates control clock CQP based on signals /CLK_NE and /CLK_PE. Control clock CQP takes H level in response to a rise of signal /CLK_PE when signal /CLK_NE is at H level and thereafter, takes L level in response to a fall of signal /CLK_NE.

Description will be given of operations in CQP generating circuit 518 below.

It is set in the following description that at first, signal DOE is at H level at all times and signals /CLK_NE and /CLK_PE are at H level and L level, respectively. At this time, an output node of NAND gate 5182 is at H level, an output node of NAND gate 5181 is at L level, and an output node of NAND gate 5183 is at H level; therefore, control clock CQP is at L level. When signal /CLK_PE takes H level in the above situation, an output node of NAND gate 5183 takes L level and control clock CQP takes H level. As for states of the output node of NAND gates 5181 and 5182 at this time, no change generates according to a change in a state of control signal /CLK_PE and control clock CQP is held at H level.

Then, when signal /CLK_NE takes L level in the situation, the output node of NAND gate 5181 takes H level and the output node of NAND gate 5182 takes L level. Then, the output node of NAND gate 5183 is inverted to H level and control clock CQP takes L level.

Thereafter, even when signal /CLK_NE again takes H level, none of states of the output nodes of NAND gates changes and control clock CQP is held at L level. Furthermore, thereafter, while when signal /CLK_PE takes L level, a state of the output node of NAND gate 5182 takes H level and a state of the output node of NAND gate 5181 takes L level, a state of the output node of NAND gate 5183 takes H level since signal /CLK_PE is at L level; therefore, control clock CQP stays at L level as is.

Figure 18:
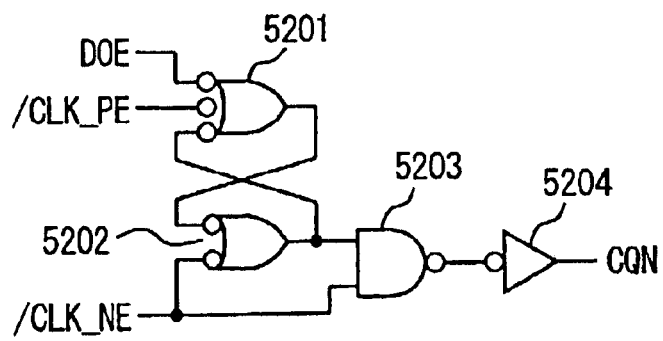
FIG. 18 is a fifth circuit diagram showing a configuration of the clock generating circuit shown in FIG. 7.

Referring to FIG. 18, CQN generating circuit 520 includes: NAND gates 5201 to 5203; and an inverter 5204. CQN generating circuit 520, when signal DOE is at H level, generates control clock CQN based on signal /CLK PE and /CLK_NE. Control clock CQN is a signal that takes H level in response to a rise of signal /CLK_NE when signal /CLK_PE is at H level and thereafter, takes L level in response to a fall of signal /CLK_PE. Since CQN generating circuit 520 is of the same configuration as CQP generating circuit 518 except that control signals /CLK_PE and /CLK_NE are interchanged therebetween, no description thereof is repeated.

Figure 19:
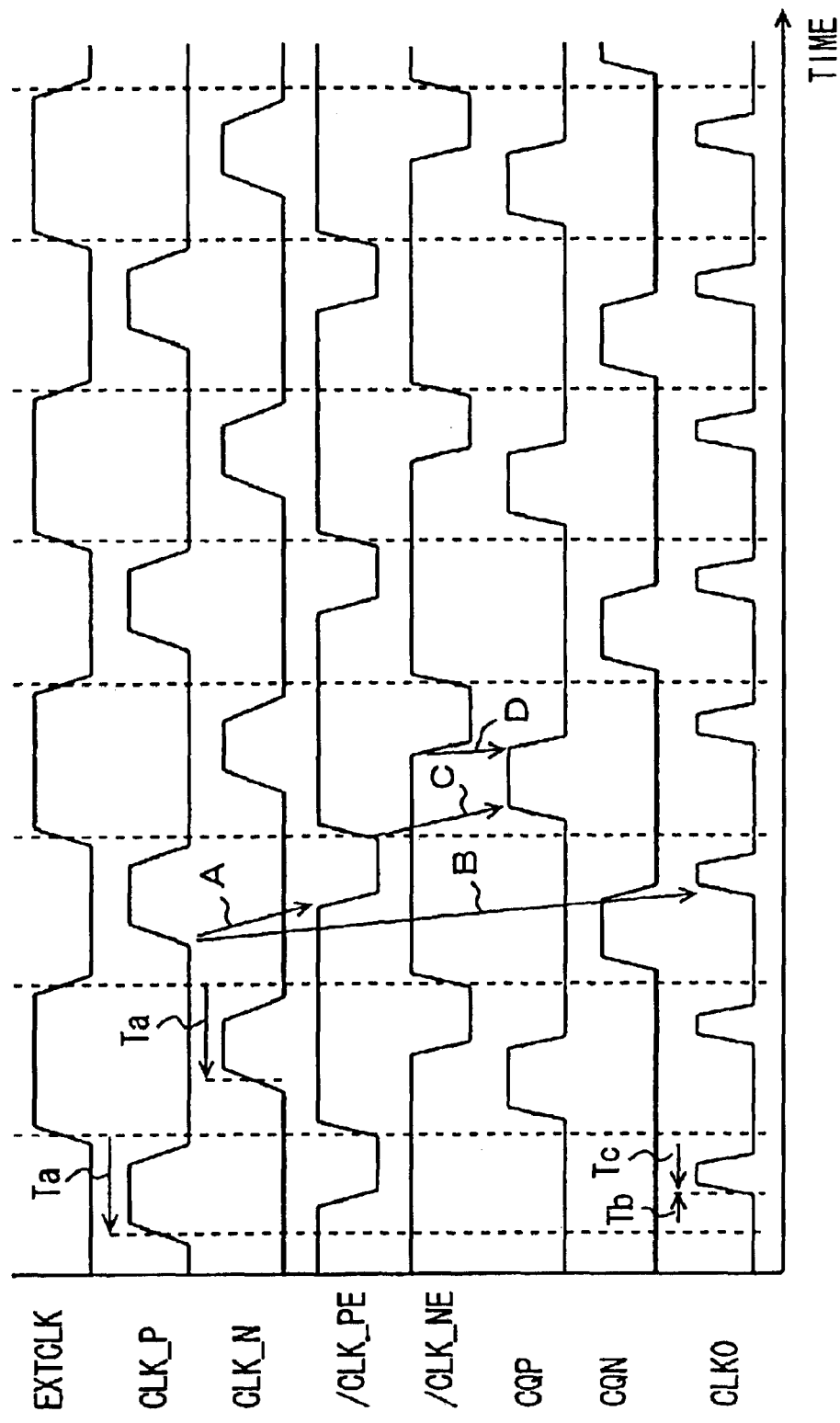
FIG. 19 is an operating waveform diagram of typical signals in a clock generating circuit.

FIG. 19 is an operating waveform diagram of typical signals in clock generating circuit 510.

Referring to FIG. 19, DLL clocks CLK_P and CLK_N are shifted backward by time Ta' with respect to a rising edge/falling edge, respectively, of external clock EXTCLK. Clock generating circuit 510 causes signal /CLK_PE to take L level (symbol A) in response to a rise of DLL clock CLK_P and simultaneously with this, generates output trigger signal CLKO, which is a pulse signal (symbol B). Clock generating circuit 510 generates control clock CQP taking H level in response to a rise of signal /CLK_PE (symbol C) and causes control signal CQP to take L level in response to a fall of signal /CLK_NE (symbol D).

What attention should be focused on is that output trigger signal CLKO is a pulse signal included in a period when signal /CLK_PE is at L level, and furthermore, control clock signal CQP is a signal generated in response to a situation in which signal /CLK_PE takes H level. That is, clock generating circuit 510 generates signals so that control clock signal CQP for shifting signal QSOE and an output trigger signal CLKO determining an output timing of data strobe signal DQS generated based on signals QSOE1 and QSOE2 obtained by shifting signal QSOE do not overlap between both signals. In this way, clock generating circuit 510 performs matching in timing of internal signal shift with signal output to outside. This applies to a relation between control clock CQN and output trigger signal CLKO in a similar manner.

Note that if, in data output circuit 200, a propagation time after read data is taken in amplifying circuits 362 and 364 till the data reaches output data latch circuit 302 is Tb and a time from output data latch circuit 302 till data DQ is outputted to outside through an output driver 304 is Tc by definition, a relation of times Ta>Tb+Tc is necessary to satisfy.

FIGS. 20 to 23 is circuit diagrams showing configurations of QSOE shift circuit 502 shown in FIG. 7.

Referring to FIGS. 20 to 23, QSOE shift circuit 502 includes a CQND generating circuit 530; a CQPD generating circuit 532; a shift circuit 534 and a signal generating circuit 536.

Figure 20:
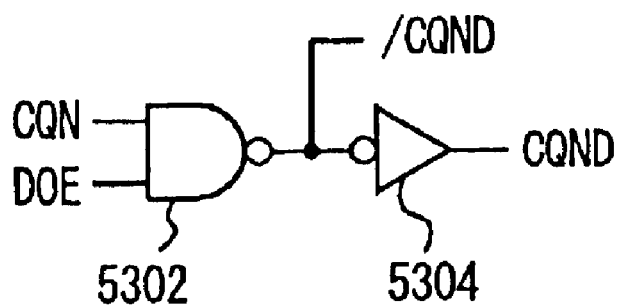
FIG. 20 is a first circuit diagram showing a configuration of a QSOE shift circuit shown in FIG. 7.

Referring to FIG. 20, CQND generating circuit 530 is constituted of: NAND gate 5302; and an inverter 5304. NAND gate 5302 performs a logical product operation of control signal CQN and signal DOE to invert a result of the operation and to output signal /CQND. Inverter 5304 inverts signal /CQND to output signal CQND.

Figure 21:
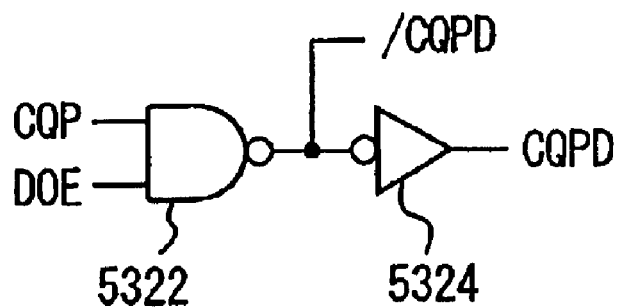
FIG. 21 is a second circuit diagram showing a configuration of the QSOE shift circuit shown in FIG. 7.

Referring to FIG. 21, CQPD generating circuit 532 is constituted of: a NAND circuit 5322 and an inverter 5324. NAND gate 5322 performs a logical product operation of control signal CQP and signal DOE to invert a result of the operation and to output signal /CQPD. Inverter 5324 inverts signal /CQPD to output signal CQPD.

When signal DOE is at H level, CQND generating circuit 530 takes in control clock CQN to generate signals CQND and /CQND, and CQPD generating circuit 532 takes in control clock CQP to generate signal CQPD and /CQPD.

Figure 22:
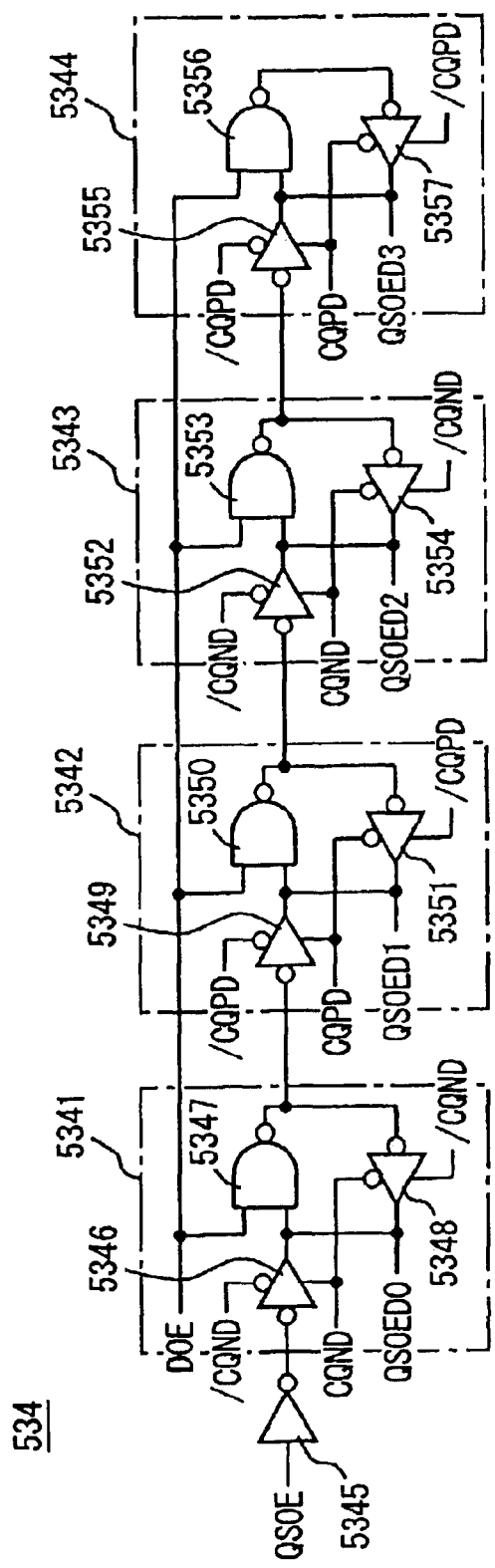
FIG. 22 is a third circuit diagram showing a configuration of the QSOE shift circuit shown in FIG. 7.

Referring to FIG. 22, shift circuit 534 includes: an inverter 5345 outputting a signal obtained by inverting signal QSOE received from READ control circuit 400; and transfer gates 5341 to 5344.

Transfer gate 5341 is constituted of: inverters 5346 and 5348; and an NAND gate 5347. Inverter 5346 is activated when signal /CQND generated by CQND generating circuit 532 is at L level (when signal CQND is at H level) to invert an output signal from inverter 5345 to output signal QSOED0. NAND gate 5347 performs a logical product operation of signal DOE and an output signal from inverter 5346 to output a signal obtained by inverting a result of the operation. Inverter 5348 is activated when signal CQND is at L level (when signal /CQND is at H level) to output a signal obtained by inverting an output signal from NAND gate 5347 to NAND gate 5347.

Transfer gate 5342 is constituted of: inverters 5349 and 5351; and an NAND gate 5350. Inverter 5349 is activated when signal /CQPD generated by CQPD generating circuit 532 is at L level (when signal CQPD is at H level) to invert an output signal from transfer gate 5341 to output signal QSOED1. NAND gate 5350 performs a logical product operation of signal DOE and an output signal from inverter 5349 to output a signal obtained by inverting a result of the operation. Inverter 5351 is activated when signal CQPD generated is at L level (when signal /CQPD is at H level) to output a signal obtained by inverting an output signal from NAND gate 5350 to NAND gate 5350.

Transfer gate 5343 is constituted of: inverters 5352 and 5354; and an NAND gate 5353. Furthermore, transfer gate 5344 is constituted of: inverters 5355 and 5357; and an NAND gate 5356. Since transfer gates 5343 and 5344 are of the same configuration as transfer gates 5341 and 5342 though transfer gates 5343 and 5344 outputs respective signals QSOE2 and QSOE3, which is different from transfer gates 5341 and 5342, no description thereof is repeated.

In shift circuit 534, transfer gates 5341 and 5343 outputting signals of input nodes thereof to output nodes thereof when control clock CQN is at H level; and transfer gates 5342 and 5344 outputting signals of input nodes thereof to output nodes thereof when control clock CQP is at H level are alternately arranged to generate signals QSOE0 to QSOED3 obtained by sequentially shifting signal QSOE in response to control clocks CQP and CQN alternately received.

Description will be given of concrete operations in shift circuit 534 below.

A case is considered where signal DOE is at H level at all times. After signal QSOE is outputted from READ circuit 400, when CQND circuit 530 receives control clock CQN to drive signal CQND to H level (signal /CQND is at L level), inverter 5346 in transfer gate 5341 at the first stage is activated. Inverter 5346 takes in a signal obtained by inverting signal QSOE with inverter 5345 to invert the signal and to output signal QSOED0. A signal obtained by inverting signal QSOED0 is outputted to an output node of NAND gate 5347. Note that inverter 5348 is inactive during a period when signal CQND is at H level.

While, when signal CQND takes L level (signal /CQND is at H level), inverter 5346 is deactivated, inverter 5348 is activated, and inverter 5348 and NAND gate 5347 constitute a latch. Therefore, signal QSOED0 and state of the output node of NAND gate 5347 are held.

In succession, when signal CQPD takes H level (signal /CQPD is at L level), inverter 5349 is activated in transfer gate 5342 at the second stage. Inverter 5349 inverts a signal outputted from transfer gate 5341 to output signal QSOED1. A signal obtained by inverting signal QSOED1 is outputted to an output node of NAND gate 5350. Note that inverter 5351 is inactive during a period when signal CQPD is at H level.

While, when signal CQPD takes L level (signal /CQPD is at H level), inverter 5349 is deactivated, inverter 5351 is activated, and inverter 5351 and NAND gate 5350 constitute a latch. Therefore, there are held signal QSOED1 and state of output node of NAND gate 5350.

Thereafter, similarly in transfer gates 5343 and 5344, a signal is transitioned in response to control clocks CQN and CQP, and signals QSOED2 and QSOED3 are sequentially outputted from respective transfer gates 5343 and 5344.

In this way, shift circuit 534 generates signals QSOED0 to QSOED3 obtained by sequentially shifting signal QSOE outputted from READ control circuit 400 in synchronization with control clocks CQN and CQP.

Figure 23:
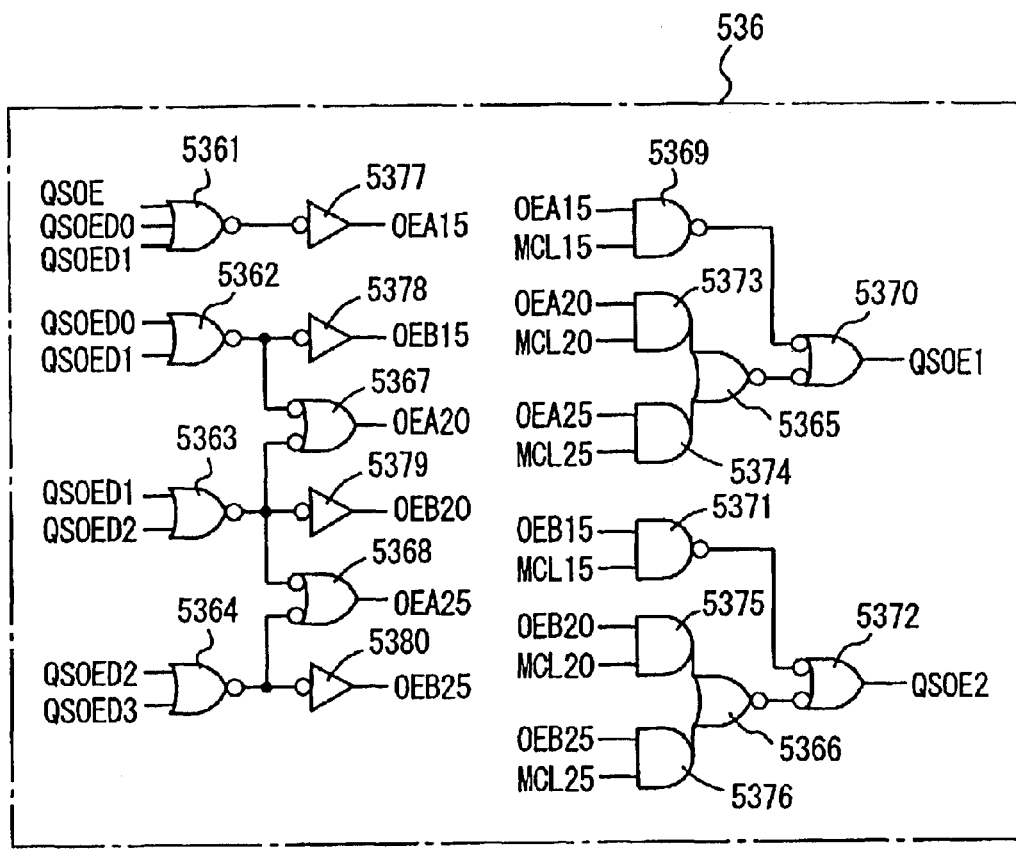
FIG. 23 is a fourth circuit diagram showing a configuration of the QSOE shift circuit shown in FIG. 7.

Referring to FIG. 23, signal generating circuit 536 includes: NOR gates 5361 to 5366; NAND gates 5367 to 5372; AND gates 5373 to 5376; and inverters 5377 to 5380.

NOR gate 5361 performs a logical sum operation of signals QSOE, QSOED0 and QSOED1 to output a signal obtained by inverting a result of the operation. Inverter 5377 inverts an output signal from NOR gate 5361 to output signal OEA15. NOR gate 5362 performs a logical sum operation of signals QSOED0 and QSOED1 to output a signal obtained by inverting a result of the operation. NOR gate 5363 performs a logical sum operation of signals QSOED1 and QSOED2 to output a signal obtained by inverting a result of the operation. NOR gate 5363 performs a logical sum operation of signals QSOED2 and QSOED3 to output a signal obtained by inverting a result of the operation.

Inverter 5378 inverts an output from NOR gate 5362 to output signal OEB15. NAND gate 5367 performs a logical product operation of output signals from NOR gates 5362 and 5363 to invert a result of the operation and to output signal OEA20. Inverter 5379 inverts an output from NOR gate 5363 to output signal OEB20. NAND gate 5368 performs a logical product operation of output signals from NOR gates 5363 and 5364 to invert a result of the operation and to output signal OEA25. Inverter 5380 inverts an output signal from NOR gate 5364 to output signal OEB25.

Furthermore, NAND gate 5369 performs a logical product operation of signal OEA15 and signal MCL15 received from READ control circuit 400 to output a signal obtained by inverting a result of the operation. AND gate 5373 performs a logical product operation of signal OEA20 and signal MCL20 received from READ control circuit 400 to output a result of the operation. AND gate 5374 performs a logical product operation of signal OEA25 and signal MCL25 received from READ control circuit 400 to output a result of the operation. NOR gate 5365 performs a logical sum operation of output signals from AND gates 5373 and 5374 to output a signal obtained by inverting a result of the operation. NAND gate 5370 performs a logical product operation of outputs signals from NAND gate 5369 and NOR gate 5365 to output signal QSOE1 obtained by inverting a result of the operation.

NAND gate 5371 performs a logical product operation of signal OEB15 and signal MCL15 to output a signal obtained by inverting a result of the operation. AND gate 5375 performs a logical product operation of signal OEB20 and signal MCL20 to output a result of the operation. AND gate 5376 performs a logical product operation of signal OEB25 and signal MCL25 to output a result of the operation. NOR gate 5366 performs a logical sum operation of output signals from AND gates 5375 and 5376 to output a signal obtained by inverting a result of the operation. NAND gate 5372 performs a logical product operation of outputs signals from NAND gate 5371 and NOR gate 5366 to output signal QSOE2 obtained by inverting a result of the operation.

Here, signals MCL15, MCL20 and MCL25 are signals included in signal MCL received from READ circuit 400 and take H level when CAS latencies CL thereof are set to 1.5, 2.0 and 2.5, respectively.

Signal generating circuit 536 uses signals QSOED0 to QSOED3 obtained by sequentially shifting signal QSOE to generate signal QSOE1 for determining the "preamble" period and signal QSOE2 for determining a period in which data strobe signal DQS transitions in synchronization with data DQ according to CAS latency (one of 1.5, 2.0 and 2.5).

Description will be given of signals in signal generating circuit 536 below.

Signal OEA15 is a signal taking H level during a period after signal QSOE received from READ circuit 400 takes H level till signal QSOED1 takes L level. Signal OEB15 is a signal taking H level during a period after signal QSOED0 takes H level till signal QSOED1 takes L level.

Signal OEA20 is a signal taking H level during a period after signal QSOED0 takes H level till signal QSOED2 takes L level. Signal OEB20 is a signal taking H level during a period after signal QSOED1 takes H level till signal QSOED2 takes L level.

Signal OEA25 is a signal taking H level during a period after signal QSOED1 takes H level till signal QSOED3 takes L level. Signal OEB25 is a signal taking H level during a period after signal QSOED2 takes H level till signal QSOED3 takes L level.

Therefore, when CAS latency is 1.5, signal QSOE1 is signal OEA15 and signal QSOE2 is signal OEB15. When CAS latency is 2.0, signal QSOE1 is signal OEA20 and signal QSOE2 is signal OEB20. When CAS latency is 2.5, signal QSOE1 is signal OEA25 and signal QSOE2 is signal OEB25. Note that concrete waveforms of signals QSOE1 and QSOE2 corresponding to signal QSOE are shown later in an overall timing chart (in a case where CAS latency CL is 1.5) of signals in data strobe signal output circuit 500.

Figure 24:
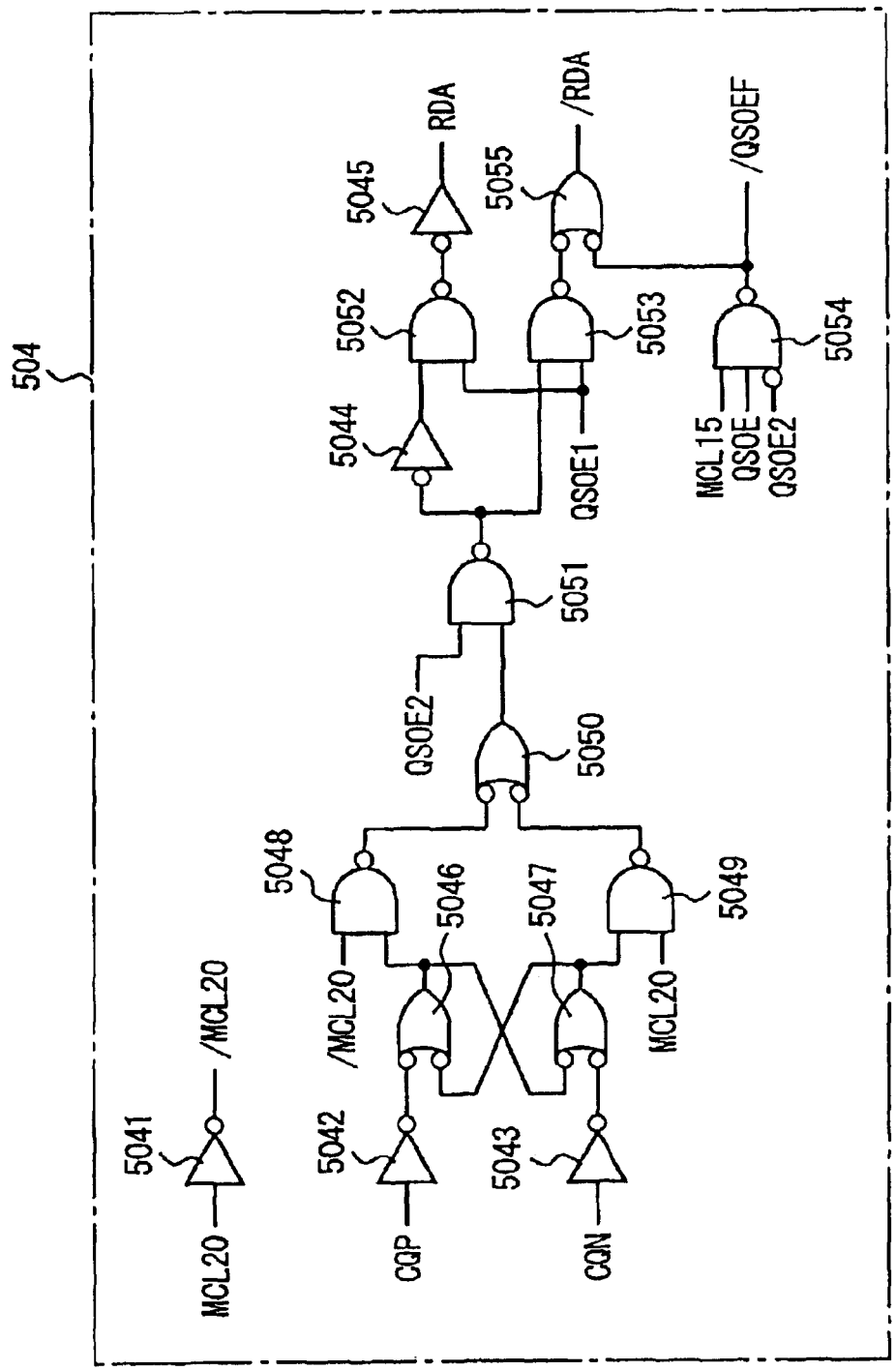
FIG. 24 is a circuit diagram showing a configuration of an output data generating circuit shown in FIG. 7.

FIG. 24 is a circuit diagram showing a configuration of output data generating circuit 504 shown in FIG. 7.

Referring to FIG. 24, output data generating circuit 504 is constituted of: inverters 5041 to 5045; and NAND gates 5046 and 5055. Inverter 5041 inverts signal MCL20 to output signal /MCL20. Inverter 5042 outputs a signal obtained by inverting control signal CQP. NAND gate 5046 performs a logical product operation of output signals from inverter 5042 and NAND gate 5047 to output a signal obtained by inverting a result of the operation. Inverter 5043 outputs a signal obtained by inverting control signal CQN. NAND gate 5047 performs a logical product operation of outputs from inverter 5043 and NAND gate 5046 to output a signal obtained by inverting a result of the operation.

NAND gate 5048 performs a logical product operation of signal /MCL20 and an output from NAND gate 5046 to output a signal obtained by inverting a result of the operation. NAND gate 5049 performs a logical product operation of signal MCL20 and an output from NAND gate 5047 to output a signal obtained by inverting a result of the operation. NAND gate 5050 performs a logical product operation of outputs from NAND gates 5048 and 5049 to output a signal obtained by inverting a result of the operation. NAND gate 5051 performs a logical product operation of signal QSOE2 and an output from NAND gate 5050 to output a signal obtained by inverting a result of the operation.

Inverter 5044 outputs a signal obtained by inverting an output signal from NAND gate 5051. NAND gate 5052 performs a logical product operation of an output signal from inverter 5044 and signal QSOE1 to output a signal obtained by inverting a result of the operation. Inverter 5045 inverts an output signal from NAND gate 5044 to output signal RDA.

NAND gate 5053 performs a logical product operation of an output signal from NAND gate 5051 and signal QSOE1 to output a signal obtained by inverting a result of the operation. NAND gate 5054 performs a logical product operation of an inverted signal of signal QSOE2 and signals MCL15 and QSOE to invert a result of the operation and to output signal /QSOEF. NAND gate 5055 operates a logical product operation of output signals from NAND gates 5053 and 5054 to invert a result of the operation and to output signal /RDA.

Output data generating circuit 504 generates signals RDA and /RDA, which is an original signal of data strobe signal DQS based on control clocks CQP and CQN.

Here, since the start point of generation of data strobe signal DQS is determined according to CAS latency, it is required that one of control clocks CQP and CQN serving as the start point of generation of signals RDA and /RDA is selected according to CAS latency CL to generate signals RDA and /RDA with a selected control clock as the start point. That is, it is required that when CAS latency CL is an integer, control clock CQN is used as the start point, while when CAS latency CL is a half integer, control clock CQP is used as the start point. In output data generating circuit 504, a circuit at the front stage including up to NAND gate 5050 is a circuit for selecting one of control clocks of CQP and CQN as a generation trigger for signals RDA and /RDA according to CAS latency CL.

On the other hand, a circuit at the rear stage after NAND gate 5051 and the circuits to follow is a circuit for generating signal RDA and /RDA based on signal QSOE1 and QSOE2 in response to a control clock selected in the front stage.

Description will be given of operations in output data generating circuits 504 below.

Here, a case is considered where CAS latency CL is 1.5. That is, signals MCL20 and /MCL20 are at L level and H level, respectively. When control clock CQP is inputted, an output node of inverter 5042 takes L level and thereby, output nodes of NAND gates 5046, 5048 and 5050 take H level, L level and H level, respectively. Since an output node of NAND gate 5047 is at L level, thereafter even if control clock CQP takes L level, a state of the output node of NAND gate 5046 is held and therefore, states of the output nodes of NAND gates 5048 and 5050 are also held.

Then, when control clock CQN is inputted, the output node of NAND gate 5047 takes H level, the output node of NAND gate 5046 takes L level and the output node of NAND gate 5048 takes H level. Since signal MCL20 is at L level, an output node of NAND gate 5049 is at H level. Therefore, the output node of NAND gate 5050 transitions from H level to L level.

In this way, when CAS latency CL is 1.5, a state of the output node of NAND gate 5050 takes H level according to control clock CQP or takes L level according to control clock CQN. This applies to a case where CAS latency CL is 2.5 in a similar manner. On the other hand, when CAS latency is 2.0, a state of the output ode of NAND gate 5050 takes H level according to control clock CQN or takes L level according to control clock CQP.

Then, description will be given of the circuit at the rear stage, and when signal QSOE2 is at H level, NAND gate 5051 works as an inverter inverting an output signal from NAND gate 5050 to output. Signal /QSOEF, which is an output signal of NAND gate 5054, takes H level, and NAND gate 5055 also works as an inverter inverting a signal from NAND gate 5053 to output. Therefore, when signal QSOE2 is at H level, signal QSOE1 is at H level, so signal outputted from NAND gate 5050 is outputted from output data generating circuit 504 as signal RDA and an inverted signal /RDA thereof.

On the other hand, when QSOE2 is at L level, signal RDA takes L level. As for signal /RDA, an operation is different between a case where CAS latency is 1.5 and a case where CAS latency is 2.0 or 2.5. In a case where CAS latency is 1.5, when signal QSOE takes H level, signal /QSOEF takes L level and signal /RDA takes H level. In a case where CAS latency is 2.0 or 2.5, signal /QSOEF is at H level at all times and NAND gate 5055 works as an inverter. Therefore, when signal QSOE1 takes H level, signal /RDA takes H level.

Note that description will be given of signal waveforms of signals RDA and /RDA in later description of an overall timing chart (in a case where CAS latency CL is 1.5) of signals in data strobe signal output circuit 500.

Figure 25:
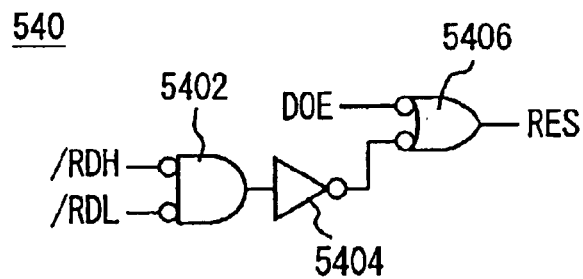
FIG. 25 is a first circuit diagram showing a configuration of an output data latch circuit shown in FIG. 7.
Figure 26:
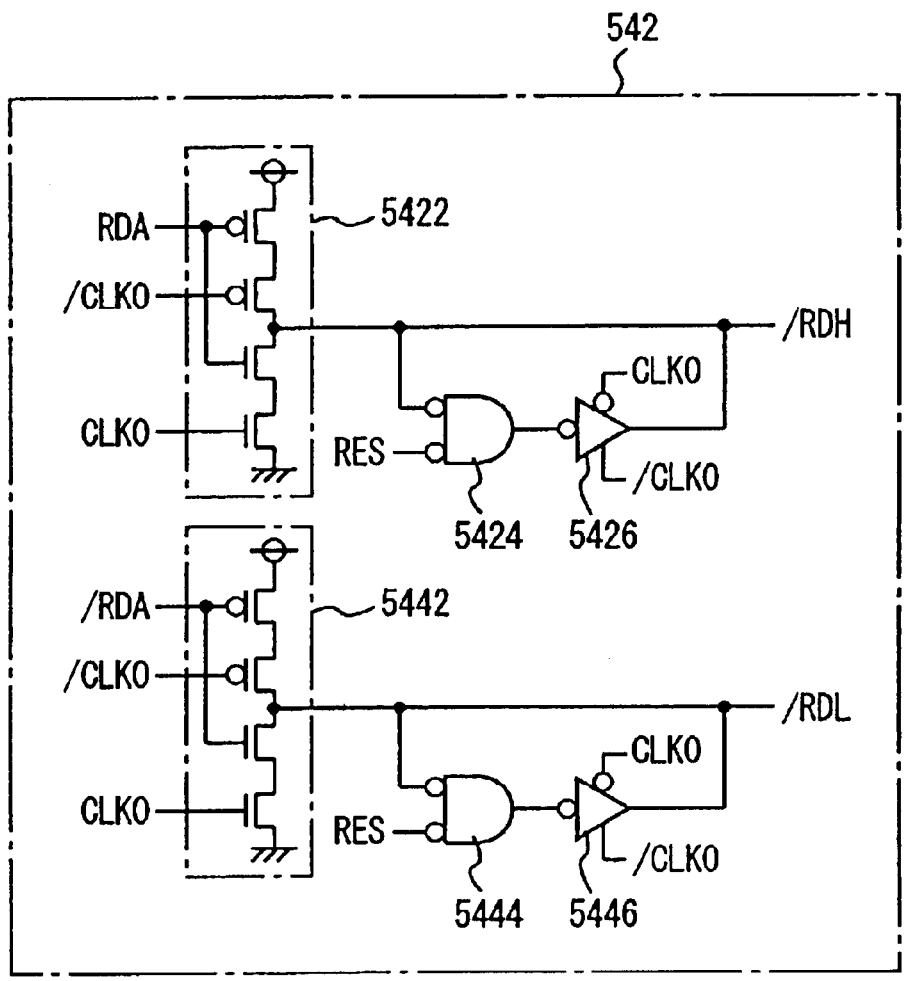
FIG. 26 is a second circuit diagram showing a configuration of the output data latch circuit shown in FIG. 7.

FIGS. 25 and 26 are circuit diagrams showing configurations of output data latch circuit 506 shown in FIG. 7.

Referring to FIGS. 25 and 26, output data latch circuit 506 includes: an RES generating circuit 540; and an output latch circuit 542.

Referring to FIG. 25, RES generating circuit 540 is constituted of: an NOR gate 5402; an inverter 5404; and an NAND gate 5406. NOR gate 5402 performs an logical sum operation of output signals /RDH and /RDL, which are output signals from output latch circuit 542, to output a signal obtained by inverting a result of the operation. Inverter 5404 outputs a signal obtained by inverting an output signal from NOR gate 5402. NAND gate 5406 performs a logical product operation of signal DOE and an output signal from inverter 5404 to invert a result of the operation and to output signal RES.

RES generating circuit 540 outputs signal RES at L level when one of signals /RDH and /RDL generated by output latch circuit 542 takes H level. As described later, when signal RES is at L level, signals /RDH and /RDL are latched in output latch circuit 542.

Referring to FIG. 26, output latch circuit 542 is constituted of: clocked inverters 5422, 5426, 5442 and 5446; and NOR gates 5424 and 5444. Clocked inverter 5422 receives output trigger signals CLKO and /CLKO as clock inputs and operates to invert signal RDA and output a signal /RDH. NOR gate 5424 performs a logical sum operation of signal /RDH and RES to output a signal obtained by inverting a result of the operation. Clocked inverter 5426 receives output trigger signals CLKO and /CLKO as clock inputs to operate in opposite phase to clocked inverters 5422 and 5442 and to output a signal /RDH obtained by inverting an output signal from NOR gate 5424.

Clocked inverter 5442 receives output trigger signals CLKO and /CLKO as clock signals to operate and to invert signal /RDA and output signal /RDL. NOR gate 5444 performs a logical sum operation of signals /RDL and RES to output a signal obtained by inverting a result of the operation. Clocked inverter 5446 receives output trigger signals CLKO and /CLKO as clock inputs to operate in opposite phase to clocked inverters 5422 and 5442 and to invert an output signal from NOR gate 5444 and output a signal /RDL.

When output latch circuit 542 receives output trigger signals CLKO at H level and /CLKO at L level, the circuit inverts signals RDA and /RDA to output respective signals /RDH and /RDL onto an output node thereof. When output trigger signals CLKO and /CLKO are inverted, clocked inverters 5422 and 5442 are deactivated, while activating clocked inverters 5426 and 5446; and when signals RDA and /RDA are outputted from output data generating circuit 504, signals /RDH and /RDL becomes complementary signals and signal RES takes L level; therefore, signal /RDH is latched by NAND gate 5424 and clocked inverter 5426, while signal /RDL is latched by NAND circuit 5444 and clocked inverter 5446.

In such a way, output data latch circuit 506 outputs signals /RDH and /RDL to output driver 508 with output trigger signals CLKO and /CLKO as triggers.

FIG. 27 is a circuit diagram showing a circuit configuration of output driver 508 shown in FIG. 7.

Referring to FIG. 27, output driver 508 is constituted of: a P-channel MOS transistor 5081; an N-channel MOS transistor 5082; and inverters 5083 to 5085. Inverter 5083 outputs a signal obtained by inverting signal /RDH and inverter 5084 outputs a signal obtained by inverting an output signal from inverter 5083. P-channel MOS transistor 5081 is connected to a power supply node 5086 and a node ND4 and receives an output signal from inverter 5084 at the gate thereof. Inverter 5085 outputs a signal obtained by inverting signal /RDL. N-channel MOS transistor 5082 is connected to node ND4 and ground node 5087 and receives an output signal from inverter 5085 at the gate thereof.

When signals /RDH and /RDL are both at H level, input gates of P-channel MOS transistor 5081 and N-channel MOS transistor 5082 takes H level and L level, respectively; therefore output nodes enter a high impedance state.

When signals /RDH and /RDL are at H level and L level, respectively, the input gates of P-channel MOS transistor 5081 and N-channel MOS transistor 5082 takes both H level; therefore, the output node thereof takes L level.

When signals /RDH and /RDL are at L level and H level, respectively, the input gates of P-channel MOS transistor 5081 and N-channel MOS transistor 5082 takes both L level; therefore, the output node thereof takes H level.

Figure 28:
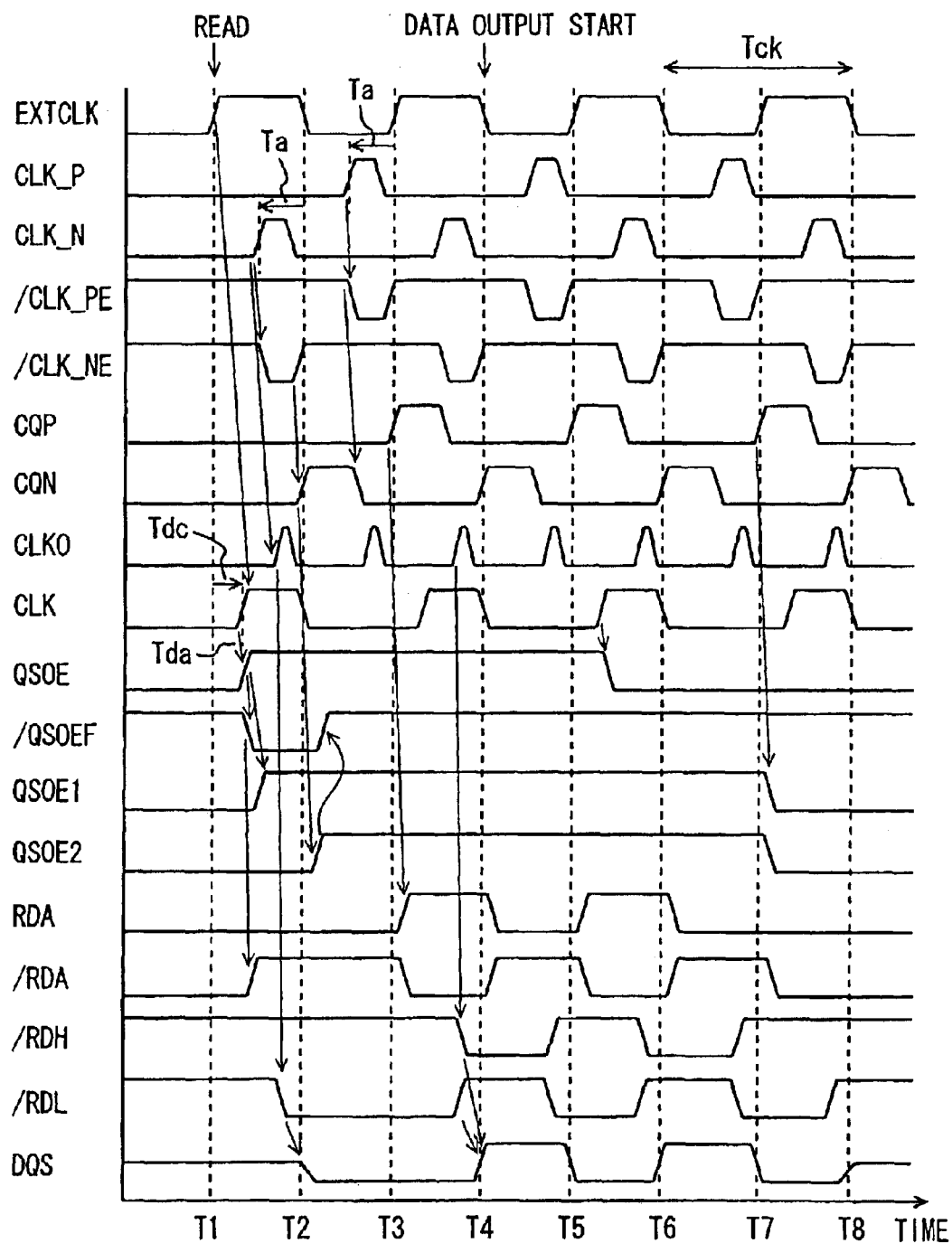
FIG. 28 is an operating waveform diagram of typical signals in a data strobe signal output circuit.

FIG. 28 is an operating waveform diagram of typical signals in data strobe signal output circuit 500 described above.

Referring to FIG. 28, in this operating waveform diagram, there is shown a case where READ command is read at time point T1 and output of data DQ is started at time point T4 when 1.5 cycles elapses thereafter. That is, there is shown a case where CAS latency CL is 1.5. Furthermore, there is shown an operating waveform diagram when an operating frequency is a low frequency satisfying the condition of above equation (1).

DLL clock CLK_P is generated by being shifted backward by time Ta' with respect to a rising edge of external clock EXTCLK. DLL clock CLK_N is generated by being shifted backward by time Ta' with respect to a falling edge of external clock EXTCLK.

Signal /CLK_PE is a signal that falls in response to a rise of DLL clock CLK_P and has a prescribed fall width. Signal /CLK_NE is a signal that falls in response to a rise of DLL clock CLK_N and has a prescribed fall width.

Control clock CQP rises in response to a rise of signal /CLK_PE and falls in response to a fall of signal /CLK_NE. Control clock CQN rises in response to a rise of signal /CLK_NE and falls in response to a fall of signal /CLK_PE.

Output trigger signal CLKO rises in response to rises of DLL clocks CLK_P and CLK_N and is a clock signal of a half cycle, having a prescribed pulse width. Here, output trigger signal CLKO is characteristically generated so that a pulse width is confined in a fall period of signal /CLK_PE and /CLK_NE and generated so as not to overlap control clocks CQP and CQN.

Signal QSOE received from READ control circuit 400 is a signal taking H level during a period of a (a burst length BL/2) cycle after READ command is received at time point T1. Here, a burst length BL is set to 4 and signal QSOE is at L level between time point T5 and time point T6. Signal QSOE1 takes H level in response to signal QSOE and takes L level in response to control clock CQP after a (a burst length BL/2+1) cycles (in the vicinity of time point T7). Signal QSOE2 takes H level in response to control clock CQN generated based on the first DLL clock CLK_N after READ command is received (in the vicinity of time point T2) and takes L level at the same time as signal QSOE1. Signal /QSOEF takes L level according to signal QSOE while taking H level according to signal QSOE2.

Signal RDA is a signal that can be outputted when signal QSOE1 is at H level, takes L level when signal QSOE2 is at L level, and when signal QSOE2 takes H level, signal RDA repeats a rise and fall in synchronization with rising edges of control clocks CQP and CQN starting at the next control clock CQP (in the vicinity of time point T3 to in the vicinity of time point T6). Note that signal RDA takes L level when signal QSOE1 is at L level.

Signal /RDA takes H level in response to when signal /QSOEF takes L level. When signal QSOE2 takes H level, and signal /RDA repeats a rise and a fall in synchronization with rising edges of control clocks CQP and CQN starting at the next control CQP (in the vicinity of time point T3 to in the vicinity of time point T7).

The above signals operate in synchronization with control signals CQP and CQN, whereas signal /RDH and /RDL operate in synchronization with output trigger signal CLKO. Signal /RDH is a signal obtained by inverting signal RDA and signal /RDL is a signal obtained by inverting signal /RDA and both signals are in synchronization with output trigger signal CLKO.

Data strobe signal DQS, which is a final output, takes L level in the "preamble" period prior to the output start of data DQ according to signals /RDH and /RDL as shown in the figure, repeats inversion in synchronization with external clock EXTCLK (a backward amount Ta of DLL clock CLK_P and CKL_N is adjusted for the synchronization), and takes L level in the "postamble" period (T2 to T8).

Note that while in the above description, DLL clock control circuit 120 is placed in the vicinity of DLL circuit 100, DLL clock control circuit 120 may be installed inside DLL circuit 100. That is, DLL clock control circuit 120 may be installed at the last output stage of DLL circuit 100, and with such construction applied, the new configuration is also substantially the same as the configuration having been described above.

As described above, since semiconductor memory device 10 according to the first embodiment 10 is installed with DLL clock control circuit 120 controlling transmission of DLL clocks CLK_PE and CLK_NF based on a detected operating frequency, DLL clocks CLK_PE and CLK_NF are transmitted only in a proper period according to an operating environment; thereby achieving reduction in active standby current and stabilization of data output operation.

According to semiconductor memory device 10, in a case where an operating frequency is low, since DLL clocks CLK_PF and CLK_NF are transmitted after READ command is received, power consumption during active standby is reduced, while in a case where an operating frequency is high, since DLL clocks CLK_PF and CLK_NF are transmitted when and after ACT command is received, a data output operation is guaranteed.

Furthermore according to semiconductor memory device 10, DLL clock control circuit 120 detects an operating frequency and determines whether or not the operating frequency satisfies the condition of equation (1); therefore an operation can be performed while being adapted to a change in the operating environment.

Furthermore, according to semiconductor memory device 10, since DLL clock control circuit 120 performs a determining operation for an operating frequency while row-related circuit are in an inactive state, transmission control of DLL clocks CLK_PF and CLK_NF based on a result of determination on operating frequency can be performed without giving consideration to operating timings of column-related circuit.

Furthermore, according to semiconductor memory device 10, since DLL clock control circuit 120 performs a determining operation for an operating frequency only during a half of an inactive period of the row-related circuit, power consumption in DLL clock control circuit 120 can be decreased.

Furthermore, according to semiconductor memory device 10, since DLL clock control circuit 120 performs a determining operation for an operating frequency only while CAS latency CL is set to 1.5, the circuit does not operate when a determining operation for an operating frequency is not necessary such as when CAS latency CL is set to a large value, thereby disabling useless power consumption.

Furthermore, according to semiconductor memory device 10, since DLL clock control circuit 120 is provided in the vicinity of DLL circuit 100 or inside the circuit, reduction in power consumption can be realized all over the regions of signal paths of DLL clocks when DLL clocks are not transmitted.

Second Embodiment

In the first embodiment, determination of a frequency is performed during a period when signal EN is at H level in frequency determining circuit 1202, and signal EN is a signal having a cycle obtained by dividing a cycle of internal clock CLK_PO into halves (a half cycle of internal clock CLK_PO) with frequency dividing circuit 1212 of frequency determining circuit 1202. The number of frequency divisions determines a sampling frequency at which a frequency determination is performed, and the reason why a signal obtained by dividing a frequency of internal clock CLK_PO in such a way is that power consumption in frequency determination circuit 1202 is reduced. In the second embodiment, the number of frequency divisions is set to larger in order to decrease power consumption in frequency determining circuit 1202.

FIGS. 29 to 32 are circuit diagrams showing configurations of frequency dividing circuits included in frequency determining circuits in a semiconductor memory device according to a second embodiment. The frequency dividing circuits generates a signal EN obtained by dividing internal clock CLK_PO into 8 divided frequencies (a cycle ⅛ times internal clock CLK_PO). Not that in semiconductor memory device according to the second embodiment, since a configuration of circuits other than a frequency dividing circuit is the same as that of semiconductor memory device 10 according to the first embodiment, no description thereof is repeated.

Figure 29:
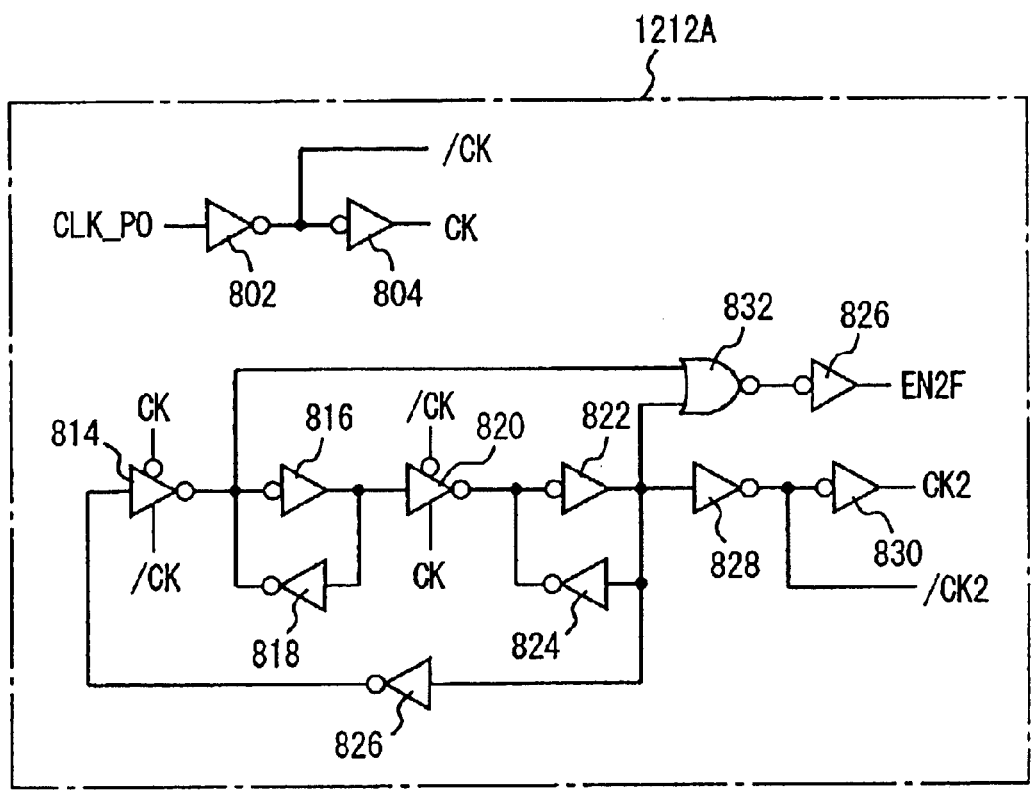
FIG. 29 is a first circuit diagram showing a configuration of a frequency dividing circuit included in a frequency determining circuit in a semiconductor memory device according to a second embodiment.

Referring to FIGS. 29 to 32, the frequency dividing circuit is constituted of circuits 1212A to 1212C; and a circuit 1218. Referring to FIG. 29, circuit 1212A is constituted of: inverters 802, 804, 814 to 830; and an NOR gate 832. While circuit 1212A is different from frequency dividing circuit 1212 in the first embodiment shown in FIG. 8 in that clock CK2 and signal EN2F are outputted instead of signal EN and EN2 and clock /CK2 complementary to clock CK2 is further outputted, the circuit configuration is the same as that of frequency dividing circuit 1212; therefore no description thereof is repeated.

Figure 30:
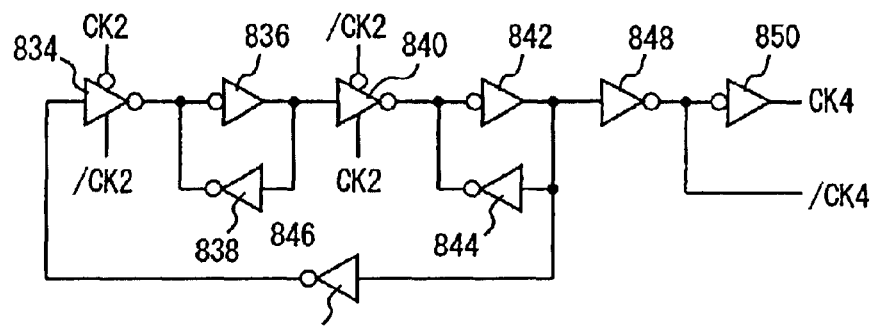
FIG. 30 is a second circuit diagram showing a configuration of the frequency dividing circuit included in a frequency determining circuit in a semiconductor memory device according to the second embodiment.

Referring to FIG. 30, circuit 1212B is constituted of: inverters 834 to 850. Inverter 834 is activated when clock CK2 is at L level (when clock /CK2 is at H level), outputs a signal obtained by inverting an output signal from inverter 846. Inverters 836 and 838 constitutes a latch circuit holding an output signal from inverter 834. Inverter 840 is activated when clock CK2 is at H level (when clock /CK2 is at L level), outputs a signal obtained by inverting an output signal from inverter 836. Inverters 842 and 844 constitute a latch circuit holding an output signal from inverter 840. Inverter 846 outputs a signal obtained by inverting an output signal from inverter 842 to inverter 834. Inverter 848 inverts an output signal from inverter 842 to output clock /CK4. Inverter 850 inverts clock /CK4 to output CK4.

Circuit 1212B generates clock CK4 and /CK4 obtained by further dividing clocks CK2 and /CK2 each into halves. That is, clock CK4 and /CK4 are clock signals obtained by dividing internal clock CLK_PO into quarters.

Figure 31:
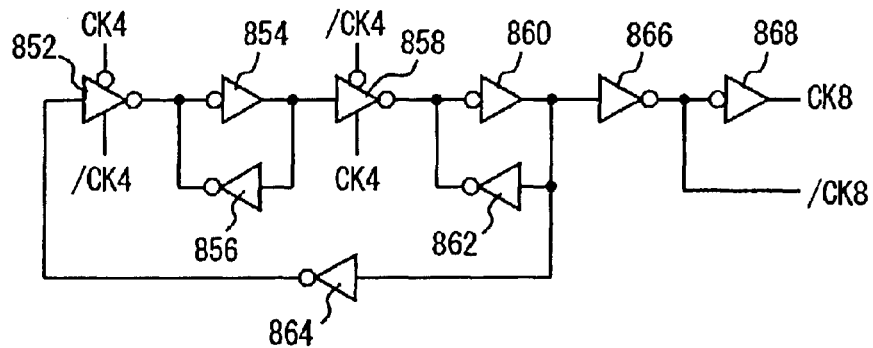
FIG. 31 is a third circuit diagram showing a configuration of the frequency dividing circuit included in a frequency determining circuit in a semiconductor memory device according to the second embodiment.

Referring to FIG. 31, circuit 1212C is constituted of: inverters 852 to 868.

While circuit 1212C is different from circuit 1212B in configuration in that clock CK4 and /CK4 are inputted instead of clocks CK2 and /CK2, and clocks CK8 and /CK8 is outputted instead of clocks CK4 and /CK4, the circuit configuration is the same as that of circuit 1212B; therefore, no description thereof is repeated.

Circuit 1212B generates clocks CK8 and /CK8 obtained by dividing clocks CK4 and /CK4 into halves. That is, clocks CK8 and /CK8 are clock signals obtained by dividing internal clock CLK_PO into 8 frequencies.

Figure 32:
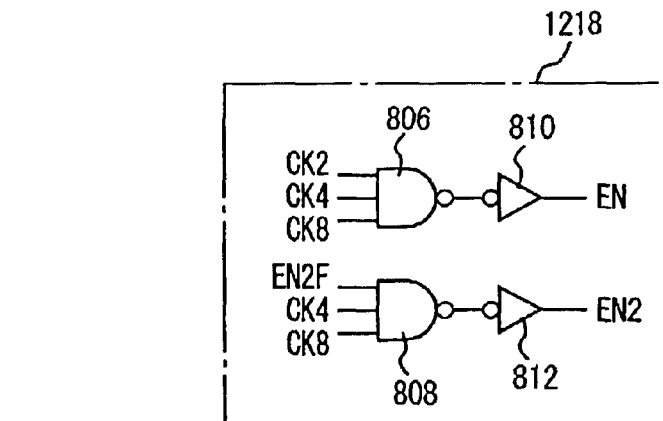
FIG. 32 is a fourth circuit diagram showing a configuration of the frequency dividing circuit included in a frequency determining circuit in a semiconductor memory device according to the second embodiment.

Referring to FIG. 32, circuit 1218 is constituted of: NAND gates 806 and 808; and inverters 810 and 812. NAND gate 806 performs a logical product operation of clock CK2, CK4 and CK8 to output a signal obtained by inverting a result of the operation. Inverter 810 inverts an output signal from NAND gate 806 to output signal EN. NAND gate 808 performs a logical product operation of signal EN2F and clocks CK4 and CK8 to output a signal obtained by inverting a result of the operation. Inverter 812 inverts an output signal from NAND gate 808 to output signal EN2.

Figure 33:
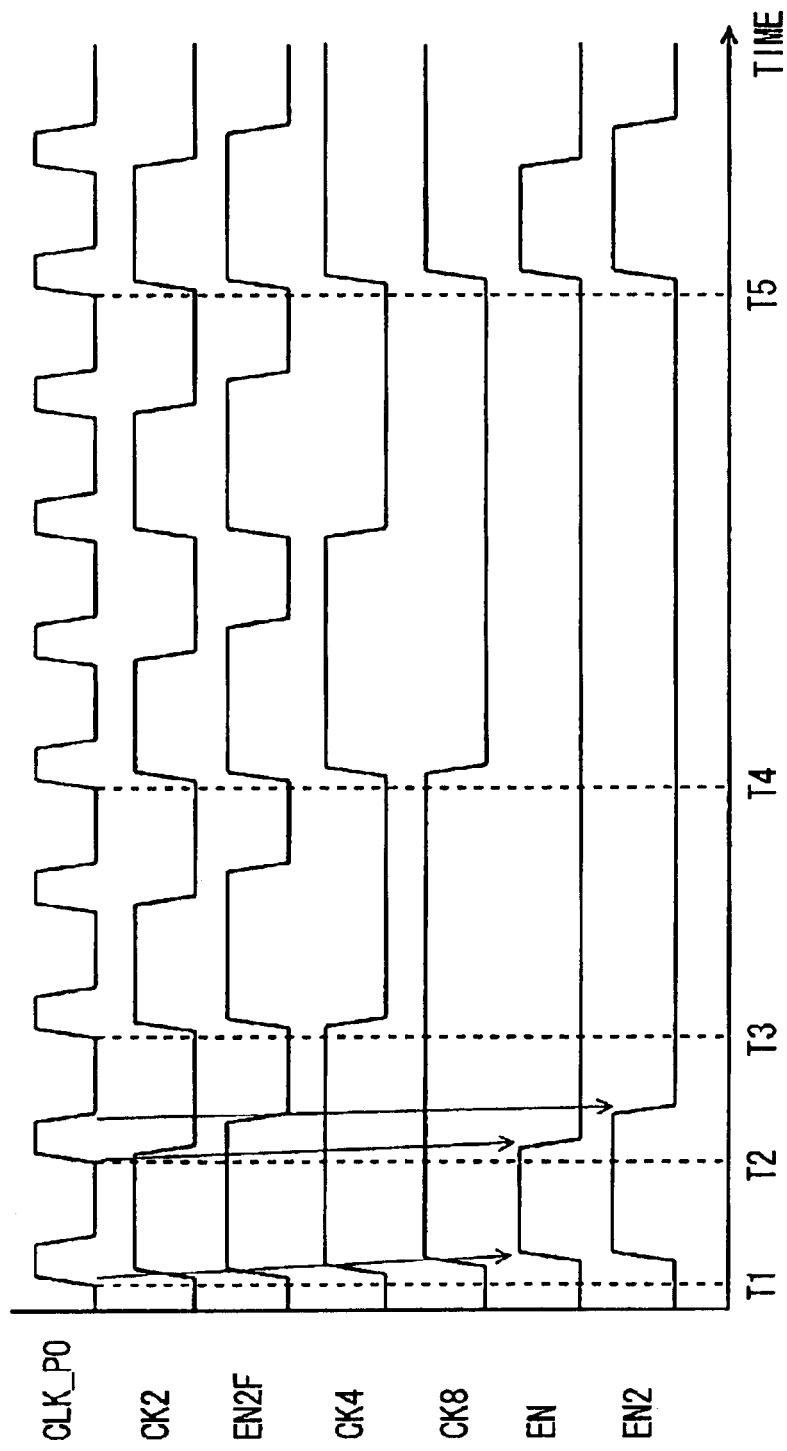
FIG. 33 is an operating waveform diagram of signals in the frequency dividing circuits shown in FIGS. 29 to 32.

FIG. 33 is an operating waveform diagram of signals in the frequency dividing circuits each constituted of circuits 1212A to 1212C and circuit 1218 shown in FIGS. 29 to 32.

Referring to FIG. 33, clock CK2 and signal EN2F rise in response to a rise of internal clock CLK_PO at time point T1, in response thereto, clock CK4 and CK8 sequentially rises, and in response to clock CK8, signals EN and EN2 rise.

When internal clock CLK_PO rises at time point T2, clock CK2 falls and in response, signal EN falls. Thereafter, when internal clock CLK_PO falls, signal EN2F falls and in response, signal EN2 falls.

At time point T3, when internal clock CLK_PO rises and in response, clock CK2 rises, clock CK4 falls. Thereafter, at time point T4, when internal clock CLK_PO rises and in response, clock CK2 rises, clock CK4 rises. Clock CK8 falls in response to a rise of clock CK4.

At time point T5, the same state as at time point T1 is restored. In such a way, signal EN is generated having a cycle ⅛ times that of internal clock CLK_PO.

Note that while in the above description, an example an 8-divided frequency is presented, to adopt 4-divided frequency or 16-or higher-divided frequency is enabled with a scheme similar to a case where alteration is implemented from a half frequency to 8-divided frequency.

As described above, according to semiconductor memory device according to the second embodiment, since an operating frequency for frequency determination is suppressed, power consumption in frequency determining circuit 120 is reduced; therefore, power consumption during active standby is further decreased.

Third Embodiment

In the first embodiment, DLL clock control circuit 120 is provided in the vicinity of DLL circuit 100 or at the last output stage in DLL circuit 100. Thereby, a signal after DLL circuit 100 (after DLL clock control circuit 120 in a case where DLL clock control circuit 120 is installed in the vicinity of DLL circuit 100) can be cut off, and during a period when a signal is cut off, power consumption can be absolutely to be zero all over the signal paths of DLL clocks.

However, in the configuration semiconductor memory device 10 according to the first embodiment, several signal wires necessary for frequency determination are required to be placed from READ control circuit 400 to DLL clock control circuit 120. Furthermore, since DLL circuit 100 is generally placed at a site remote from READ control circuit 400, data output circuit 200 and data strobe signal output circuit 500, wires for signals necessary for frequency determination becomes longer.

Therefore, in the third embodiment, a frequency determining circuit is installed inside READ control circuit and only output enable signal DLLENCLK generated based on a result of the determination by frequency determining circuit is transmitted to DLL circuit. Thereby, the number of wires from READ control circuit to DLL circuit required in other wise, which is of a long distance, can be a single wire only.

Figure 34:
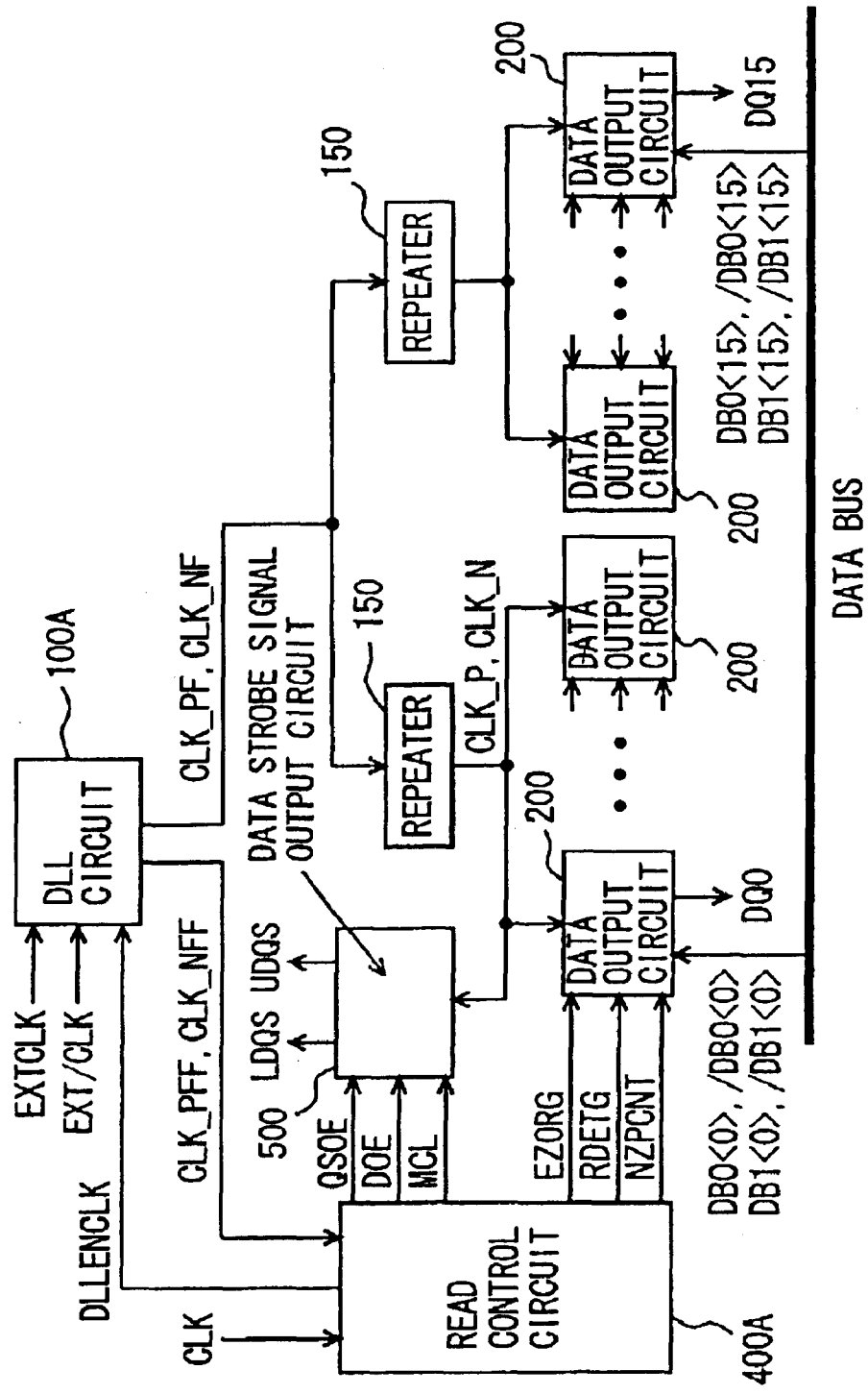
FIG. 34 is a functional block diagram conceptually describing a READ-related circuit in a semiconductor memory device according to a third embodiment.

FIG. 34 is a functional block diagram conceptually describing a READ-related circuit in a semiconductor memory device according to a third embodiment.

Referring to FIG. 34, the READ-related circuit is configured so that in the configuration of the READ-related circuit in the first embodiment shown in FIG. 2, DLL clock control circuit 120 is not installed and DLL circuit 100A and READ control circuit 400A are installed instead of DLL circuit 100 and READ control circuit 400.

READ control circuit 400A includes DLL clock control circuit 120A and outputs output enable signal DLLENCLK generated by DLL clock control circuit 120A to DLL circuit 100A. DLL circuit 100A outputs DLL clocks CLK_PFF and CLK_NFF not controlled by output enable signal DLLENCLK received from READ control circuit 400A to READ control circuit 400A, and outputs DLL clocks CLK_PF and CLK_NF to repeater 150 based on output enable signal DLLENCLK received from READ control circuit 400A.

Note that the other parts of a construction of the READ-related circuit is the same as the corresponding parts of the configuration of READ-related circuit of the first embodiment shown in FIG. 2; therefore none of descriptions thereof is repeated.

Figure 35:
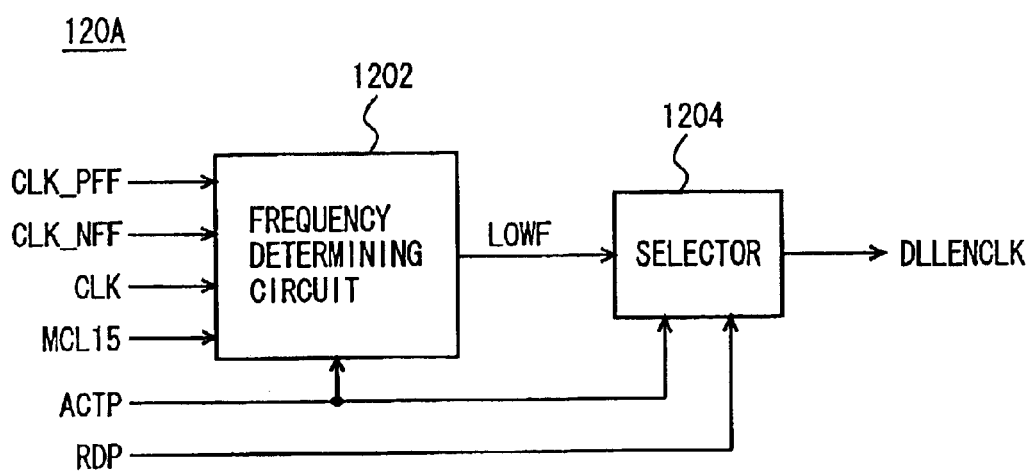
FIG. 35 is a functional block diagram functionally describing a DLL clock control circuit included in a READ control circuit shown in FIG. 34.

FIG. 35 is a functional block diagram functionally describing DLL clock control circuit 120A included in READ control circuit 400A shown in FIG. 34.

Referring to FIG. 35, DLL clock control circuit 120A is constituted of a frequency determining circuit 1202; and a selector 1204. While DLL clock control circuit 120A is different from DLL clock control circuit 120 in that DLL clock control circuit 120A receives DLL clock CLK_PFF and CLK_NFF instead of internal clocks CLK_PO and CLK_NO, neither of AND gates 1206 and 1208 is included, the construction thereof is the same as the configuration of frequency determining circuit and selector of DLL clock control circuit 120; therefore, none of descriptions thereof is repeated.

Since DLL clocks CLK_PFF and CLK_NFF received by DLL clock control circuit 120A are signals transmitted from DLL circuit 100A, it is common that values of delay amounts Td1 to Td3 in frequency determining circuit 1202 of DLL clock control circuit 120A are different from values of delay amounts Td1 to Td3 in frequency determining circuit 1202 of DLL clock control circuit 120 in the first embodiment; therefore the values are set so as to be suitable for a semiconductor memory device in the third embodiment.

Figure 36:
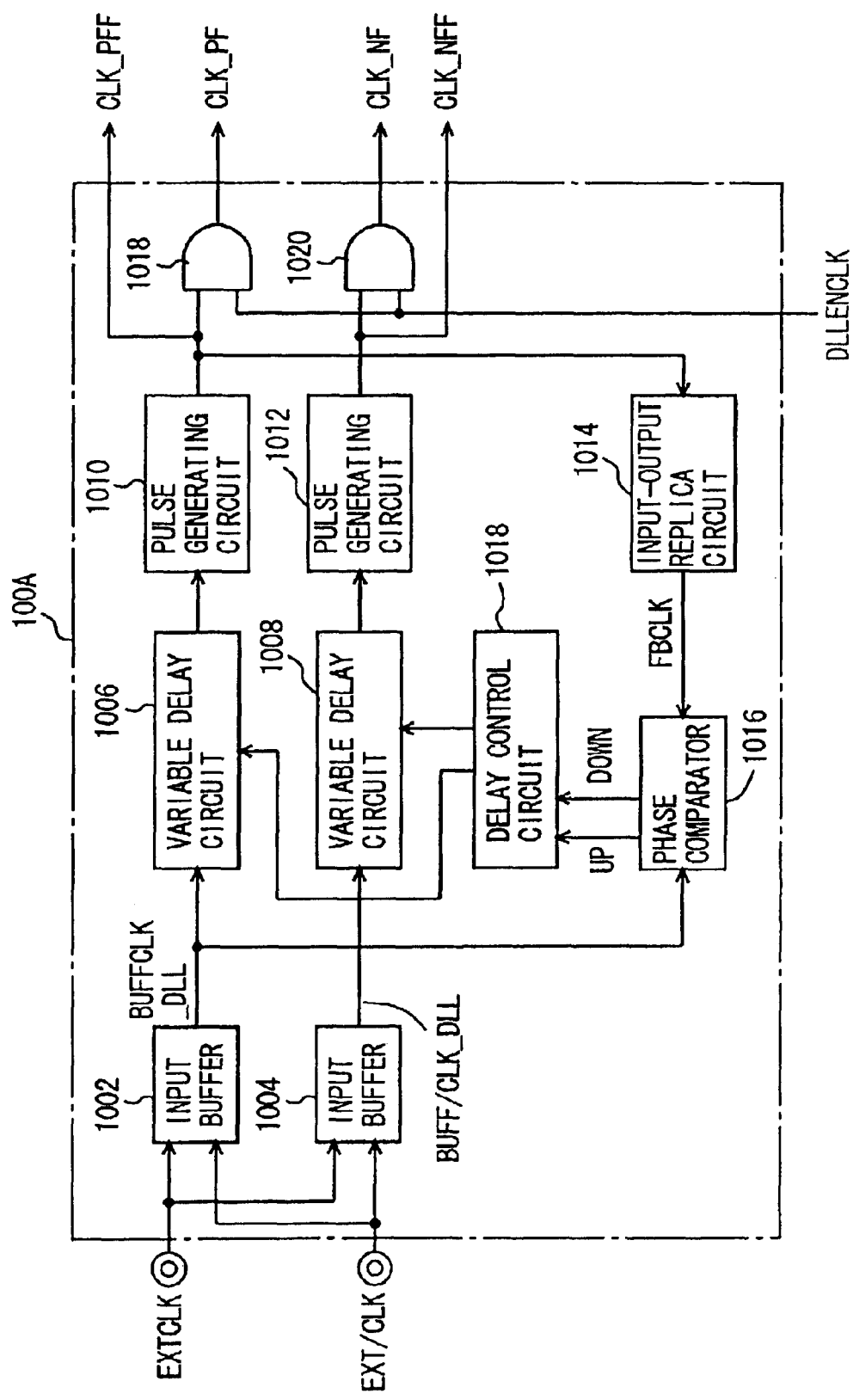
FIG. 36 is a functional block diagram functionally describing a DLL circuit shown in FIG. 34.

FIG. 36 is a functional block diagram functionally describing DLL circuit 100A shown in FIG. 34.

Referring to FIG. 36, DLL circuit 100A further includes: AND gates 1018 and 1020 in addition to the configuration of DLL circuit 100 shown in FIG. 3. AND gate 1018 performs a logical product operation of an output signal from pulse generating circuit 1010 and output enable signal DLLENCLK received from READ control circuit 400A to output a result of the operation as DLL clock CLK_PF. AND gate 1020 performs a logical product operation of an output signal from pulse generating circuit 1012 and output enable signal DLLENCLK to output a result of the operation as DLL clock CLK_NF. DLL circuit 100A outputs output signals from pulse generating circuits 1010 and 1012 as respective DLL clocks CLK_PFF and CLK_NFF.

DLL circuit 100A outputs DLL clocks CLK_PFF and CLK_NFF not controlled by output enable signal DLLENCLK to DLL clock control circuit 120A included in READ control circuit 400A. DLL circuit 100A receives output enable signal DLLENCLK, which is a result of frequency determination, from DLL clock control circuit 120A and outputs DLL clocks CLK_PF and CLK_NF to repeater 150 when output enable signal DLLENCLK is at H level.

As described above, according to a semiconductor memory device according to the third embodiment, a single wire over a long distance from READ control circuit 400A to DLL circuit 100A can be sufficient for transmission.

Fourth Embodiment

As described above, a distance between READ control circuit and DLL circuit is generally long; therefore wiring over a long distance is necessary through the first through third embodiments through the number of wires are different according to a case. In the fourth embodiment, DLL clock control circuit is provided inside READ control circuit, and output enable signal DLLENCLK is outputted to repeater placed between DLL circuit; and a group of data output circuits and data strobe signal generating circuit. With such a placement, no necessity arises for a wiring over a long distance between READ control circuit and DLL circuit.

Figure 37:
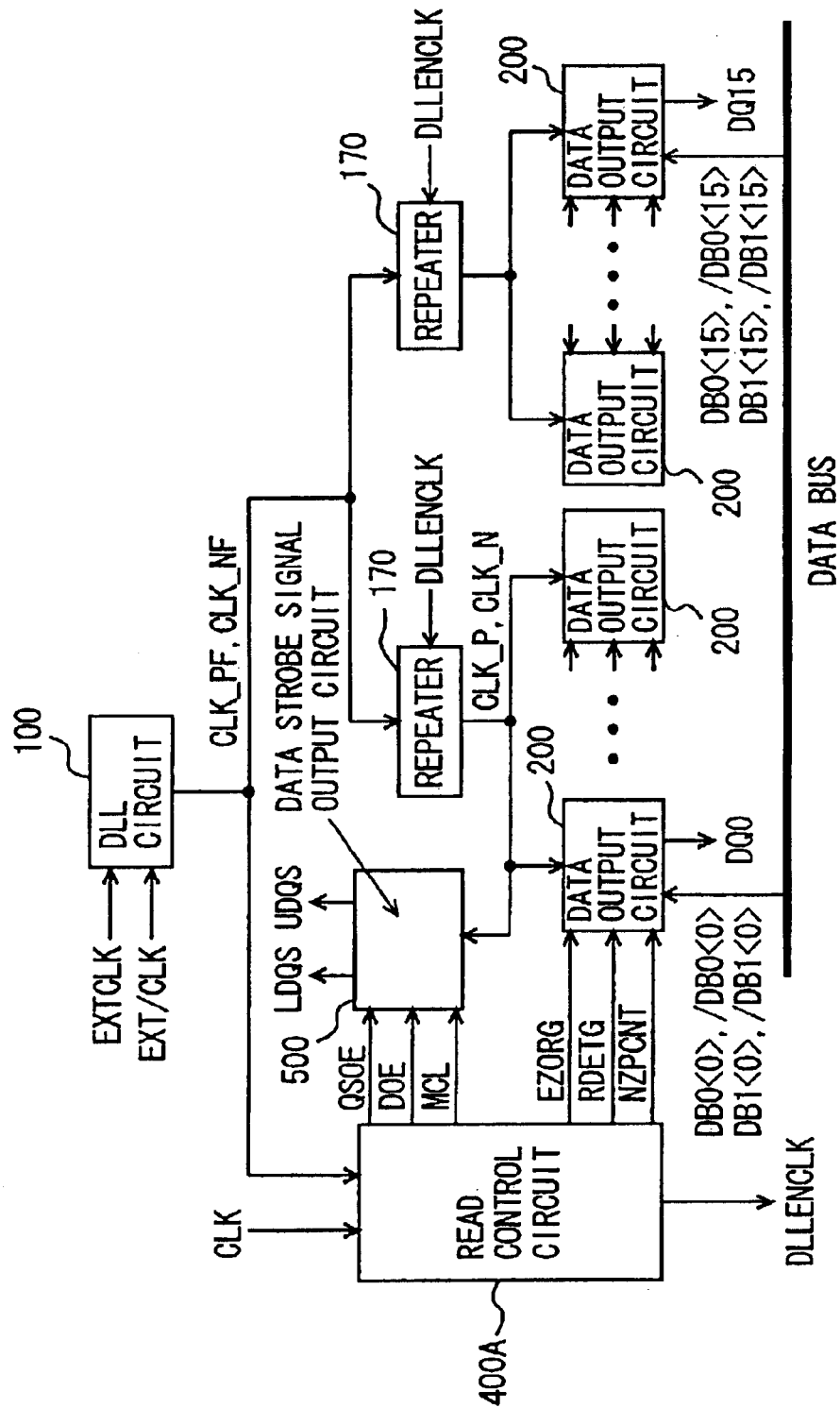
FIG. 37 is a functional block diagram conceptually describing a READ-related circuit in a semiconductor memory device according to a fourth embodiment.

FIG. 37 is a functional block diagram conceptually describing a READ-related circuit in a semiconductor memory device according to a fourth embodiment.

Referring to the READ-related circuit is configured so that in the configuration of the READ-related circuit in the first embodiment shown in FIG. 2, no DLL clock control circuit 120 is provided and a READ control circuit 400A and a repeater 170 are provided instead of READ control circuit 400 and repeater 150, respectively.

READ control circuit 400A includes: DLL clock control circuit 120A and outputs output enable signal DLLENCLK generated by the DLL clock control circuit 120A is outputted to repeater 170. Repeater 170 outputs DLL clocks CLK_P and CLK_N based on output enable signal DLLENCLK received from READ control circuit 400A.

A configuration of READ control circuit has been described in the third embodiment, no description thereof is repeated. The other parts of the configuration of the READ-related circuit except for repeater 170 and READ control circuit 400A are the same as corresponding parts of the configuration of READ-related circuit in the first embodiment shown in FIG. 2, therefore, none of descriptions thereof is repeated either.

Figure 38:
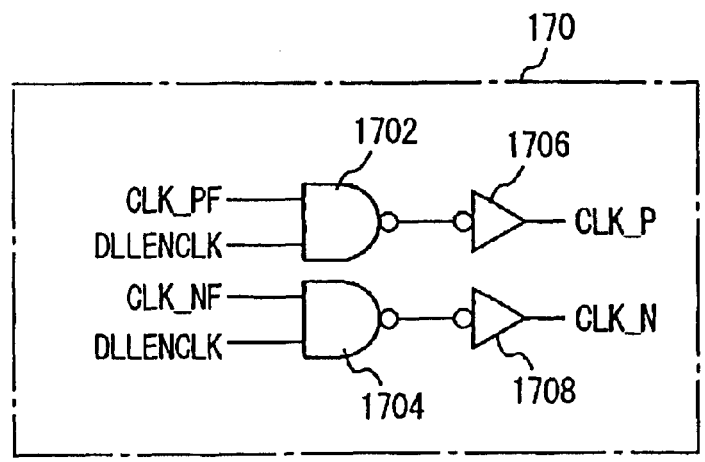
FIG. 38 is a circuit diagram showing a configuration of a repeater shown in FIG. 37.
Figure 39:
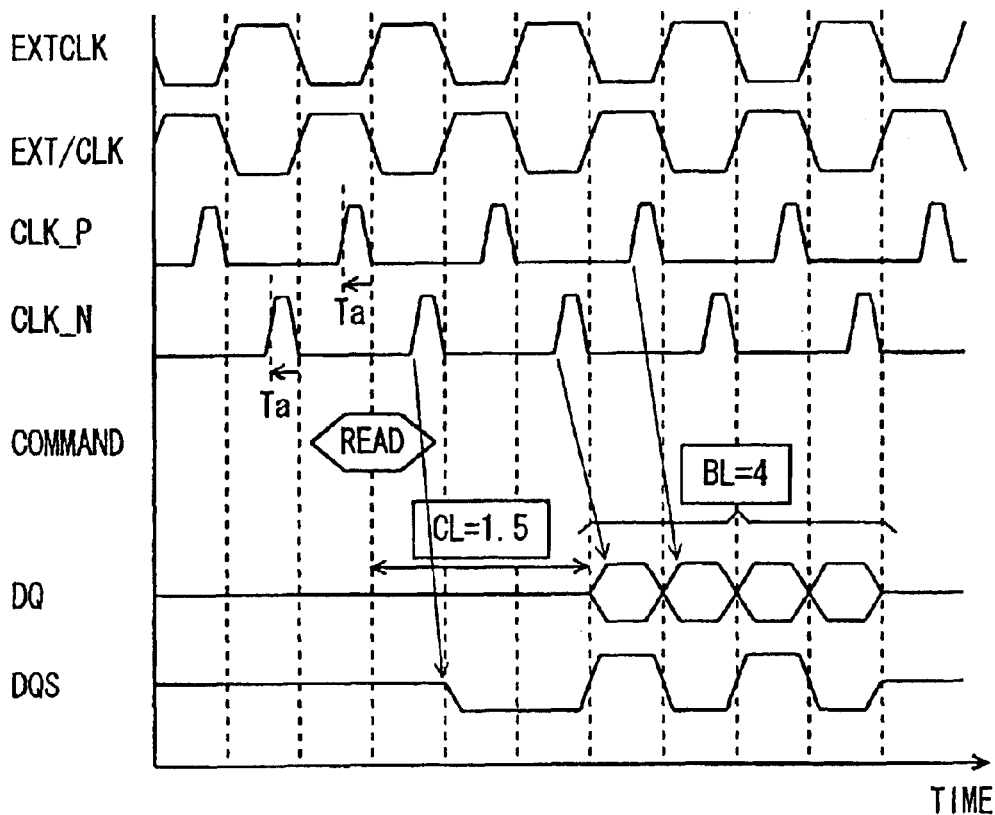
FIG. 39 is an operating waveform diagram of main signals in data reading from a conventional DDR SDRAM.
Figure 40:
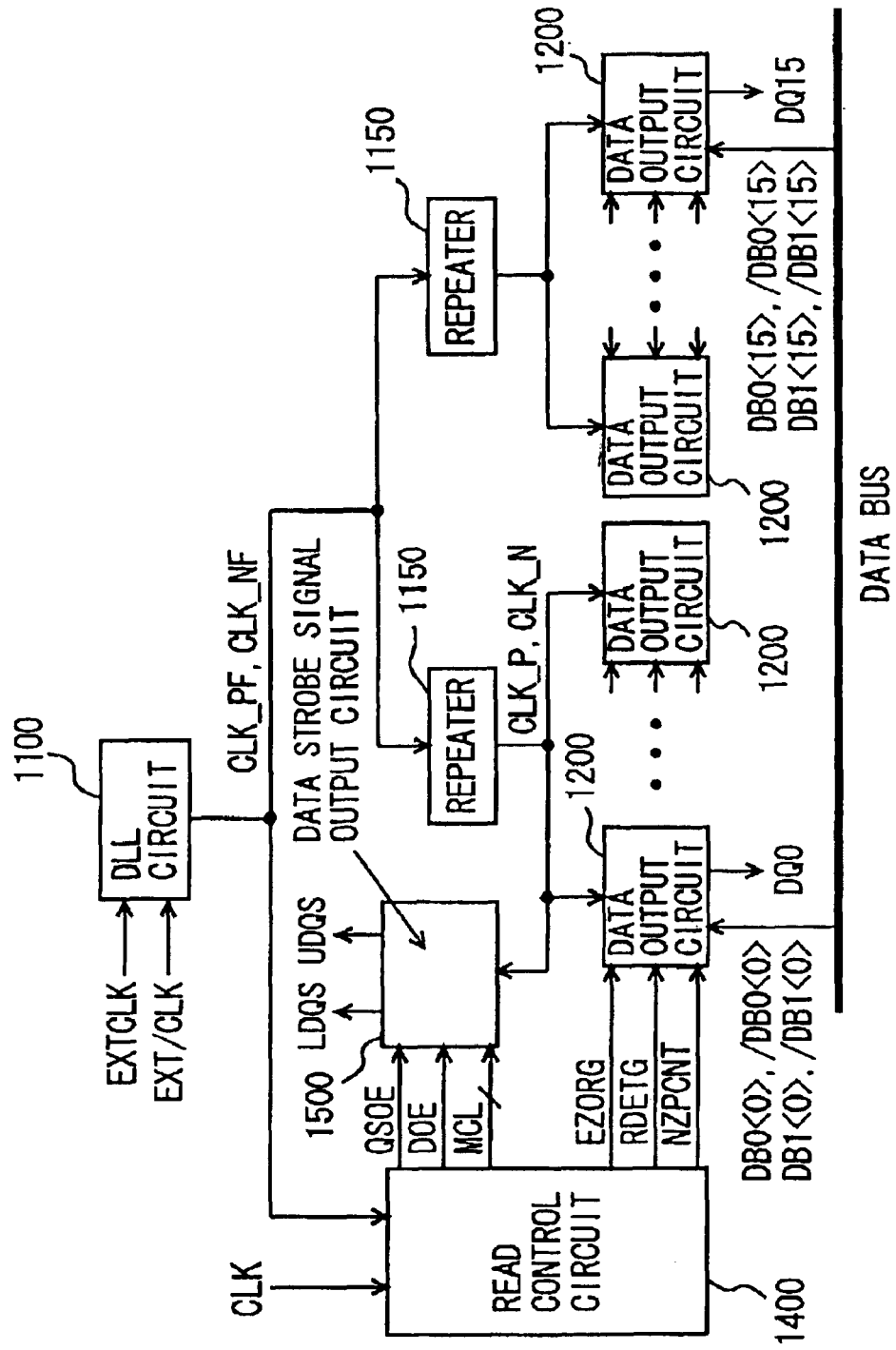
FIG. 40 is a functional block diagram conceptually describing a READ-related circuit operating according to internal clocks generated in a DLL circuit of a conventional semiconductor memory device.

FIG. 38 is a circuit diagram showing a configuration of repeater 170 shown in FIG. 37.

Referring to FIG. 38, repeater 170 includes: NAND gates 1702 and 1704, and inverters 1706 and 1708. NAND gate 1702 performs a logical product operation of DLL clock CLK_PF outputted from DLL circuit 100 and output enable signal DLLENCLK outputted from READ control circuit 400A to output a signal obtained by inverting a result of the operation. Inverter 1706 inverts an output signal from NAND gate 1702 to output DLL clock CLK_P. NAND gate 1704 performs a logical product operation of DLL clock CLK_NF and output enable signal DLLENCLK to output a signal obtained by inverting a result of the operation. Inverter 1708 inverts an output signal from NAND gate 1704 to output DLL clock CLK_N.

Repeater 170 outputs DLL clocks CLK_P and CLK_N when output enable signal DLLENCLK received from READ control circuit 400A is at H level.

As described above, according to the semiconductor memory device according to the fourth embodiment, since there is provided READ control circuit 400A including DLL clock control circuit 100A generating output enable signal DLLENCLK and an output destination of output enable signal DLLENCLK is repeater 170, no necessity arises for wiring over a long distance between READ control circuit 400A and DLL circuit 100.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device which inputs and outputs data in synchronization with a rise and fall of an external clock, comprising:
   a memory cell array storing data;
   a clock generating circuit generating first and second internal clocks corresponding to the rise and fall of said external clock, respectively;
   a data output circuit receiving said first and second internal clocks to output the data read from said memory cell array to outside based on said first and second internal clocks;
   a data strobe signal output circuit receiving said first and second internal clocks, generating a data strobe signal coinciding with or in synchronization with an output timing of said data outputted to outside from said data output circuit, and outputting said data strobe signal to outside based on said first and second internal clocks; and
   an internal clock control circuit receiving said first and second internal clocks, detecting an operating frequency of the semiconductor memory device based on said first and second internal clocks, and controlling a transmission period during which said first and second internal clocks generated in said clock generating circuit are transmitted to said data output circuit and said data strobe signal output circuit, based on said operating frequency.

2. The semiconductor memory device according to claim 1, wherein
   said internal clock control circuit, when said operating frequency is higher than a prescribed frequency, adopts as said transmission period a period elapsing after an activation command instructing an access to a memory cell included in said memory cell array is received at least before data is completely output.

3. The semiconductor memory device according to claim 1, wherein
   said internal clock control circuit, when said operating frequency is lower than a prescribed frequency, adopts as said transmission period a period elapsing after a data read command is received at least before data is completely output.

4. The semiconductor memory device according to claim 3, wherein
   said prescribed frequency is the maximum frequency at which said data strobe signal output circuit can output said data strobe signal at a prescribed CAS latency when said first and second internal clocks are transmitted after receiving said data read command.

5. The semiconductor memory device according to claim 3, wherein
   said internal clock control circuit generates a first signal imitating a timing at which said data strobe signal output circuit receives said first and second internal clocks, and a second signal imitating a timing at which said data strobe signal output circuit is activated, and determines whether or not said operating frequency is lower than said prescribed frequency based on a relation in phase between said first and second signals.

6. The semiconductor memory device according to claim 3, wherein
   said internal clock control circuit performs a determination on whether or not said operating frequency is lower than said prescribed frequency, when no access is made to a memory cell included in said memory cell array.

7. The semiconductor memory device according to claim 6, wherein
   said internal clock control circuit performs said determination in a cycle longer than a cycle corresponding to said operating frequency.

8. The semiconductor memory device according to claim 3, wherein
   said internal clock control circuit, when a CAS latency is a prescribed value, determines whether or not said operating frequency is lower than said prescribed frequency.

9. The semiconductor memory device according to claim 1, wherein
   said internal clock control circuit is placed in the vicinity of said clock generating circuit, and transmits said first and second internal clocks received from said clock generating circuit during said transmission period.

10. The semiconductor memory device according to claim 1, wherein
    said internal clock control circuit is included in said clock generating circuit, and
    said clock generating circuit transmits said generated first and second internal clocks during said transmission period.

11. The semiconductor memory device according to claim 1, wherein
    said internal clock control circuit generates an output enable signal being active during said transmission period, and
    said clock generating circuit receives said output enable signal from said internal clock control circuit, and transmits said first and second internal clocks while said output enable signal is active.

12. The semiconductor memory device according to claim 1, further comprising:
    a signal recovery circuit provided in a signal path along which said first and second internal clocks are transmitted to recover a signal level, wherein
    said internal clock control circuit generates an output enable signal being active during said transmission period, and
    said signal recovery circuit receives said output enable signal from said internal clock control circuit, and transmits said first and second internal clocks received from said clock generating circuit to said data output circuit and said data strobe signal output circuit while said output enable signal is active.

13. The semiconductor memory device according to claim 1, wherein
    said internal clock control circuit includes:
    a frequency determining circuit determining whether or not said operating frequency is lower than a prescribed frequency; and
    a selector activating an output enable signal instructing transmission of said first and second internal clocks based on a data read command when a result of determination that said operating frequency is lower than said prescribed frequency is received from said frequency determining circuit, and activating said output enable signal based on an activation command instructing an access to a memory cell included in said memory cell array when a result of determination that said operating frequency is higher than said prescribed frequency is received from said frequency determining circuit.

14. The semiconductor memory device according to claim 13, wherein said frequency determining circuit includes:

a signal generating circuit generating a first signal imitating a timing at which said data strobe signal output circuit receives said first and second internal clocks, and a second signal imitating a timing at which said data strobe signal output circuit is activated; and a determining circuit determining whether or not said operating frequency is lower than said prescribed frequency based on a relation in phase between said first and second signals.

15. The semiconductor memory device according to claim 14, wherein said frequency determining circuit further includes a frequency dividing circuit dividing said first and second clocks in frequency, wherein said determining circuit determines whether or not said operating frequency is lower than said prescribed frequency in a cycle obtained by frequency dividing with said frequency dividing circuit.

* * * * *